(12) United States Patent
Pehlke

(10) Patent No.: US 12,250,010 B2
(45) Date of Patent: Mar. 11, 2025

(54) SYSTEMS AND METHODS FOR DIPLEXER CIRCUITS WITH LEAKAGE CANCELLATION

(71) Applicant: Skyworks Solutions, Inc., Irvine, CA (US)

(72) Inventor: David Richard Pehlke, Westlake Village, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 442 days.

(21) Appl. No.: 17/657,585

(22) Filed: Mar. 31, 2022

(65) Prior Publication Data

US 2022/0329268 A1 Oct. 13, 2022

Related U.S. Application Data

(60) Provisional application No. 63/171,811, filed on Apr. 7, 2021, provisional application No. 63/171,803, filed on
(Continued)

(51) Int. Cl.
*H04B 1/525* (2015.01)
*H03H 7/46* (2006.01)
(Continued)

(52) U.S. Cl.
CPC ........... *H04B 1/0057* (2013.01); *H03H 7/463* (2013.01); *H04B 1/0483* (2013.01);
(Continued)

(58) Field of Classification Search
CPC ........ H04B 1/0057; H04B 1/525; H04B 1/44; H04B 1/18; H03H 7/463
See application file for complete search history.

(56) References Cited

U.S. PATENT DOCUMENTS

| 3,993,994 A | 11/1976 | Goggins |
| 5,712,641 A * | 1/1998 | Casabona .......... H04B 7/18513 342/372 |

(Continued)

FOREIGN PATENT DOCUMENTS

CN 104617970 5/2015

*Primary Examiner* — Hai V Nguyen
(74) *Attorney, Agent, or Firm* — Knobbe, Martens, Olson & Bear, LLP

(57) ABSTRACT

Systems and methods for diplexer circuits with leakage cancellation are provided. In one aspect, a diplexer circuit including first and second radio frequency transceiver terminals and a first antenna terminal, and first and second parallel communication paths extending between the first radio frequency transceiver terminal and the first antenna terminal, and third and fourth parallel communication paths extending between the second radio frequency transceiver terminal and the first antenna terminal. The circuit also includes a first phase shifter configured to apply a first phase shift to a first radio frequency transmit signal on the first communication path, a second phase shifter configured to apply a second phase shift to a second radio frequency on the second communication path, and a third phase shifter configured to apply a third phase shift to the first radio frequency transmit signal on the third communication path.

20 Claims, 18 Drawing Sheets

Related U.S. Application Data on Apr. 7, 2021, provisional application No. 63/171,809, filed on Apr. 7, 2021.

(51) Int. Cl.

| | | |
|---|---|---|
| *H04B 1/00* | (2006.01) | |
| *H04B 1/04* | (2006.01) | |
| *H04B 1/10* | (2006.01) | |
| *H04B 1/12* | (2006.01) | |
| *H04B 1/16* | (2006.01) | |
| *H04B 1/18* | (2006.01) | |
| *H04B 1/3805* | (2015.01) | |
| *H04B 1/44* | (2006.01) | |

(52) U.S. Cl.
CPC ............ *H04B 1/1081* (2013.01); *H04B 1/12* (2013.01); *H04B 1/1607* (2013.01); *H04B 1/18* (2013.01); *H04B 1/3805* (2013.01); *H04B 1/44* (2013.01); *H04B 1/525* (2013.01); *H04B 2001/0408* (2013.01); *H04B 2001/3811* (2013.01)

(56) References Cited

U.S. PATENT DOCUMENTS

| | | | |
|---|---|---|---|
| 5,994,985 A | 11/1999 | Pehlke et al. | |
| 6,388,537 B1* | 5/2002 | Matsumoto | H01P 1/2131 |
| | | | 333/135 |
| 8,774,067 B2* | 7/2014 | Rousu | H04B 1/18 |
| | | | 455/75 |
| 9,215,110 B2* | 12/2015 | Shen | H04L 27/0014 |
| 9,571,183 B2* | 2/2017 | Runyon | H01Q 1/1264 |
| 9,755,668 B2* | 9/2017 | Mandegaran | H04B 1/48 |
| 9,941,908 B2* | 4/2018 | Bauder | H04B 1/0057 |
| 10,050,529 B2 | 8/2018 | Pehlke et al. | |
| 10,057,902 B2* | 8/2018 | Ebihara | H04L 5/14 |
| 10,615,835 B2 | 4/2020 | Pehlke et al. | |
| 10,811,754 B2* | 10/2020 | Wang | H01P 5/188 |
| 10,840,951 B2* | 11/2020 | Bauder | H04B 7/0602 |
| 10,911,073 B2* | 2/2021 | Schmidhammer | H04B 1/006 |
| 10,992,063 B2* | 4/2021 | Sano | H04B 1/04 |
| 11,362,425 B2* | 6/2022 | Ananth | H01Q 21/28 |
| 11,387,797 B2 | 7/2022 | Drogi et al. | |
| 11,558,079 B2 | 1/2023 | Raghavan et al. | |
| 11,589,418 B2* | 2/2023 | Patel | H01Q 21/28 |
| 11,615,279 B1* | 3/2023 | Kratz | H03H 7/40 |
| | | | 343/860 |
| 11,658,615 B2 | 5/2023 | Balteanu et al. | |
| 11,716,100 B2 | 8/2023 | Pehlke | |
| 11,888,502 B2* | 1/2024 | Pehlke | H03H 9/725 |
| 11,916,577 B2* | 2/2024 | Pehlke | H04B 1/12 |
| 12,015,210 B2 | 6/2024 | Lenive | H01Q 3/46 |
| 2003/0161419 A1 | 8/2003 | Bach et al. | |
| 2005/0012676 A1* | 1/2005 | McCarthy | H01P 5/12 |
| | | | 343/853 |
| 2007/0207747 A1 | 9/2007 | Johnson et al. | |
| 2008/0279122 A1* | 11/2008 | Fukuda | H04B 1/525 |
| | | | 370/278 |
| 2010/0099370 A1* | 4/2010 | Nichols | H01Q 21/20 |
| | | | 343/893 |
| 2011/0038429 A1* | 2/2011 | Sako | H04B 7/0617 |
| | | | 333/32 |
| 2011/0116423 A1* | 5/2011 | Rousu | H04B 1/18 |
| | | | 455/75 |
| 2011/0261734 A1* | 10/2011 | Dupuy | H04B 1/0053 |
| | | | 455/73 |
| 2014/0241480 A1* | 8/2014 | Shen | H04L 25/03821 |
| | | | 375/373 |
| 2014/0328222 A1 | 11/2014 | Mao et al. | |
| 2015/0087246 A1* | 3/2015 | Khlat | H04B 1/40 |
| | | | 455/77 |
| 2015/0117280 A1* | 4/2015 | Khlat | H04B 1/50 |
| | | | 370/297 |
| 2015/0117281 A1* | 4/2015 | Khlat | H03H 7/463 |
| | | | 370/297 |
| 2015/0244072 A1* | 8/2015 | Harel | H01Q 1/246 |
| | | | 342/372 |
| 2015/0255868 A1 | 9/2015 | Haddad et al. | |
| 2015/0288389 A1* | 10/2015 | Khlat | H04B 7/01 |
| | | | 370/297 |
| 2015/0318876 A1* | 11/2015 | Resnati | H01Q 21/08 |
| | | | 370/297 |
| 2015/0341058 A1* | 11/2015 | Khlat | H04B 1/58 |
| | | | 370/297 |
| 2015/0381265 A1* | 12/2015 | Runyon | H01Q 1/288 |
| | | | 455/13.3 |
| 2016/0099733 A1* | 4/2016 | Weissman | H03F 1/3223 |
| | | | 455/114.2 |
| 2016/0112072 A1* | 4/2016 | Bauder | H04B 1/005 |
| | | | 370/297 |
| 2016/0127016 A1 | 5/2016 | Pehlke et al. | |
| 2016/0134412 A1* | 5/2016 | Zimmerman | H01Q 5/00 |
| | | | 370/297 |
| 2016/0359506 A1* | 12/2016 | Ellae | H04B 1/52 |
| 2017/0094662 A1* | 3/2017 | Ebihara | H04W 72/0453 |
| 2017/0302429 A1* | 10/2017 | Brighenti | H04B 1/0057 |
| 2017/0310284 A1* | 10/2017 | Altunkilic | H03F 1/3205 |
| 2017/0365921 A1* | 12/2017 | Webb | H04B 1/40 |
| 2018/0108962 A1* | 4/2018 | So | H01P 1/184 |
| 2018/0159562 A1* | 6/2018 | Bauder | H04B 1/005 |
| 2019/0115644 A1* | 4/2019 | Wang | H01P 5/183 |
| 2019/0123699 A1 | 4/2019 | Andrys et al. | |
| 2019/0181890 A1* | 6/2019 | Schmidhammer | H04B 1/0057 |
| 2019/0221921 A1* | 7/2019 | Resnati | H04B 1/0057 |
| 2019/0361088 A1 | 11/2019 | Bajor et al. | |
| 2020/0044345 A1* | 2/2020 | Zimmerman | H04W 16/28 |
| 2020/0076406 A1 | 3/2020 | Mazotta | |
| 2020/0194897 A1* | 6/2020 | Ananth | H04B 1/525 |
| 2020/0314601 A1* | 10/2020 | Hormis | H04B 7/155 |
| 2020/0321697 A1* | 10/2020 | Zimmerman | H01Q 21/26 |
| 2020/0328503 A1* | 10/2020 | Li | H01Q 5/307 |
| 2020/0335880 A1* | 10/2020 | Sano | H01Q 1/1264 |
| 2021/0099199 A1* | 4/2021 | Pehlke | H04B 1/123 |
| 2021/0195687 A1* | 6/2021 | Patel | H01Q 21/28 |
| 2021/0203422 A1* | 7/2021 | Gale | H01Q 3/267 |
| 2021/0218422 A1 | 7/2021 | Pehlke | |
| 2021/0226344 A1* | 7/2021 | Wu | H01Q 21/065 |
| 2022/0029645 A1* | 1/2022 | Säily | H04B 1/30 |
| 2022/0029646 A1* | 1/2022 | Abramov | H04B 1/0057 |
| 2022/0045743 A1* | 2/2022 | Ashworth | G06F 17/14 |
| 2022/0059949 A1* | 2/2022 | Rottmoser | H04B 1/005 |
| 2022/0123828 A1* | 4/2022 | Yu | H04B 7/18513 |
| 2022/0166655 A1 | 5/2022 | Bendlin et al. | |
| 2022/0291395 A1* | 9/2022 | Iyengar | H01Q 9/42 |
| 2022/0294394 A1* | 9/2022 | Roblin | H03F 1/0288 |
| 2022/0329267 A1* | 10/2022 | Kwun | H04B 1/401 |
| 2022/0329268 A1* | 10/2022 | Pehlke | H03H 7/463 |
| 2022/0329269 A1* | 10/2022 | Pehlke | H04B 1/18 |
| 2022/0329273 A1* | 10/2022 | Pehlke | H03H 9/725 |
| 2023/0065202 A1 | 3/2023 | Pehlke | |
| 2023/0069775 A1 | 3/2023 | Tai et al. | |
| 2023/0119378 A1 | 4/2023 | Pehlke | |
| 2024/0160878 A1* | 5/2024 | Kratz | H04B 1/18 |

\* cited by examiner

SYSTEMS AND METHODS FOR DIPLEXER CIRCUITS WITH LEAKAGE CANCELLATION

CROSS-REFERENCE TO RELATED APPLICATION(S)

Any and all applications for which a foreign or domestic priority claim is identified in the Application Data Sheet as filed with the present application are hereby incorporated by reference under 37 CFR 1.57.

BACKGROUND

Field

Aspects of this disclosure relate to radio frequency (RF) communication systems, and in particular, cancelling signal leakage in such systems.

Description of the Related Technology

RF communication systems typically include an RF front end which couples transmit and receive paths between a baseband processor and one or more antennas. Such RF front ends may include power amplifier(s), low noise amplifier(s), and/or filter(s) to process RF signals transmitted to and received from the antennas. One design considerations for RF front ends is to limit or otherwise reduce the amount of a transmit signal that is leaked onto a receive path.

SUMMARY

The systems, methods and devices of this disclosure each have several innovative aspects, no single one of which is solely responsible for the desirable attributes disclosed herein.

In one aspect, there is provided a diplexer circuit comprising: first and second radio frequency transceiver terminals and a first antenna terminal; first and second parallel communication paths extending between the first radio frequency transceiver terminal and the first antenna terminal, and third and fourth parallel communication paths extending between the second radio frequency transceiver terminal and the first antenna terminal; a first phase shifter configured to apply a first phase shift to a first radio frequency transmit signal between the first radio frequency transceiver terminal and a first diplexer on the first communication path, a second phase shifter configured to apply a second phase shift to a second radio frequency transmit signal between the first antenna terminal and a second diplexer on the second communication path, and a third phase shifter configured to apply a third phase shift to the first radio frequency transmit signal between the first diplexer and the second radio frequency transceiver terminal on the third communication path.

The second phase shifter can be further configured to coherently sum the first and second radio frequency transmit signals, and wherein the second phase shifter is further configured to coherently sum third and fourth radio frequency transmit signals received from the second radio frequency transceiver terminal.

The first phase shifter can be further configured to destructively cancel leakage of third and fourth radio frequency transmit signals received from the second radio frequency transceiver terminal, and wherein the third phase shifter is further configured to destructively cancel leakage of the first and second radio frequency transmit signals received from the first radio frequency transceiver terminal.

The first phase shifter can include a first hybrid transmit splitter, the second phase shifter can include a second hybrid receive splitter, and the third phase shifter can include a third hybrid antenna splitter.

The diplexer circuit can further comprise: a third radio frequency transceiver terminal coupled to the first phase shifter; a fourth radio frequency transceiver terminal coupled to the third phase shifter; a second antenna terminal coupled to the second phase shifter; fifth and sixth parallel communication paths extending between the third radio frequency transceiver terminal and the second antenna terminal; and seventh and eighth parallel communication paths extending between the fourth radio frequency transceiver terminal and the second antenna terminal.

The first phase shifter can be further configured to apply a fourth phase shift to a third radio frequency transmit signal between the third radio frequency terminal and the first diplexer on the fifth communication path, wherein the second phase shifter is further configured to apply a fifth phase shift to a fourth radio frequency transmit signal between the third antenna terminal and the second diplexer on the sixth communication path, and the third phase shifter is further configured to apply a sixth phase shift to the third radio frequency transmit signal between the first diplexer and the second radio frequency transceiver on the seventh communication path.

The first radio frequency transceiver terminal can be configured to communicate via a cellular signal, and the second radio frequency transceiver terminal can be configured to communicate via a Wi-Fi signal.

The first phase shifter and the third phase shifter can be configured to provide a phase shift of about 180° to the first radio frequency transmit signal.

The first phase shifter and the second phase shifter can be configured to provide a phase shift of about 90° to each of the first and second radio frequency transmit signals.

The third phase shifter can be configured to apply a fourth phase shift to a second radio frequency transmit signal between the second radio frequency terminal and the first diplexer on the third communication path, and the second phase shifter can be configured to apply a fifth phase shift to a fourth radio frequency transmit signal between the first antenna terminal and the first diplexer on the fourth communication path.

The second phase shifter and the third phase shifter can be configured to provide a phase shift of about 90° to each of the third and fourth radio frequency transmit signals.

In another aspect, there is provided a method of diplexing radio frequency signals, the method comprising: outputting first and second radio frequency transmit signals onto respective first and second parallel communication paths extending between a first radio frequency transceiver terminal and an antenna; applying a first phase shift to the first radio frequency transmit signal between the first radio frequency terminal and a first diplexer on the first communication path; outputting third and fourth radio frequency transmit signals onto respective third and fourth parallel communication paths extending between a second radio frequency transceiver and the antenna; applying a second phase shift to the second radio frequency transmit signal between the antenna and a second diplexer on the second communication path; and applying a third phase shift to the third radio frequency receive signal between the first diplexer and the second radio frequency transceiver on the third communication path.

The method can further comprise: combining the first and second radio frequency transmit signals at a splitter; and providing the combined first and second radio frequency transmit signals to the antenna.

The method can further comprising: combining third and fourth radio frequency transmit signals received from the second radio frequency transceiver terminal at the splitter; and providing the combined third and fourth radio frequency transmit signals to the antenna.

The method can further comprise: destructively cancelling the first and second radio frequency transmit signals at a splitter coupled to the second radio frequency transceiver terminal.

The method can further comprising: destructively cancelling leakage of third and fourth radio frequency transmit signals received from the second radio frequency transceiver terminal at a first splitter coupled to the first radio frequency transceiver terminal; and destructively cancelling leakage of the first and second radio frequency transmit signals at a second splitter coupled to the second radio frequency transceiver terminal.

In yet another aspect, there is provided a radio frequency system comprising: first and second radio frequency transceivers; a first antenna; and a diplexer circuit includes first and second parallel communication paths extending between the first radio frequency transceiver and the first antenna, third and fourth parallel communication paths extending between the second radio frequency transceiver and the first antenna, a first phase shifter configured to apply a first phase shift to a first radio frequency transmit signal between the first radio frequency transceiver and a first diplexer on the first communication path, a second phase shifter configured to apply a second phase shift to a second radio frequency transmit signal between the first antenna and a second diplexer on the second communication path, and a third phase shifter configured to apply a third phase shift to the first radio frequency transmit signal between the first diplexer and the second radio frequency transceiver on the third communication path.

The second phase shifter can be further configured to coherently sum the first and second radio frequency transmit signals, and the second phase shifter can be further configured to coherently sum third and fourth radio frequency transmit signals received from the second radio frequency transceiver.

The first phase shifter can be further configured to destructively cancel leakage of third and fourth radio frequency transmit signals received from the second radio frequency transceiver, and the third phase shifter can be further configured to destructively cancel leakage of the first and second radio frequency transmit signals received from the first radio frequency transceiver.

The first phase shifter can include a first hybrid transmit splitter, the second phase shifter can include a second hybrid receive splitter, and the third phase shifter can include a third hybrid antenna splitter.

DETAILED DESCRIPTION OF EMBODIMENTS

Figure 1:
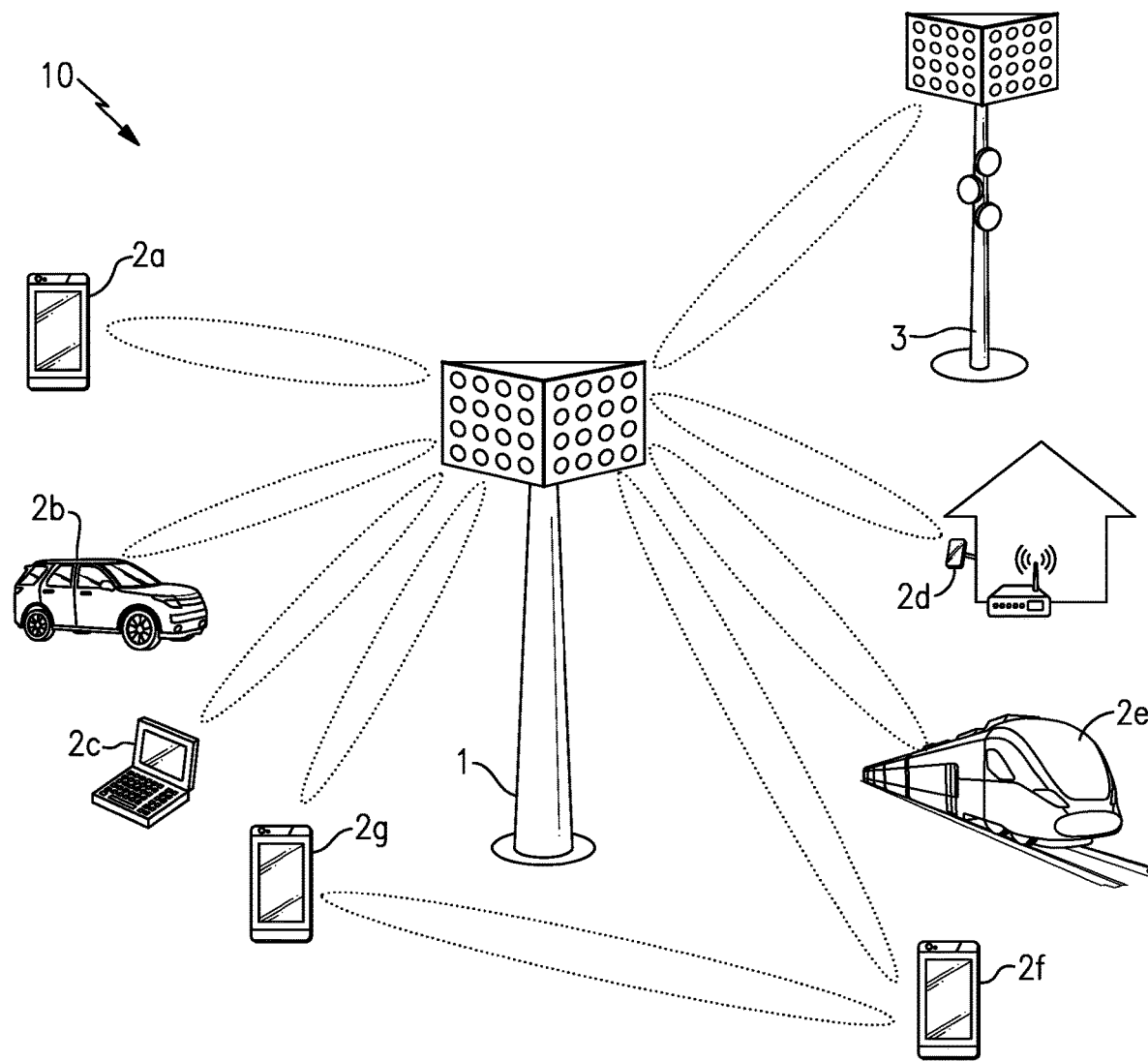
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Overview of 5G Systems

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such radio frequency (RF) functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2:
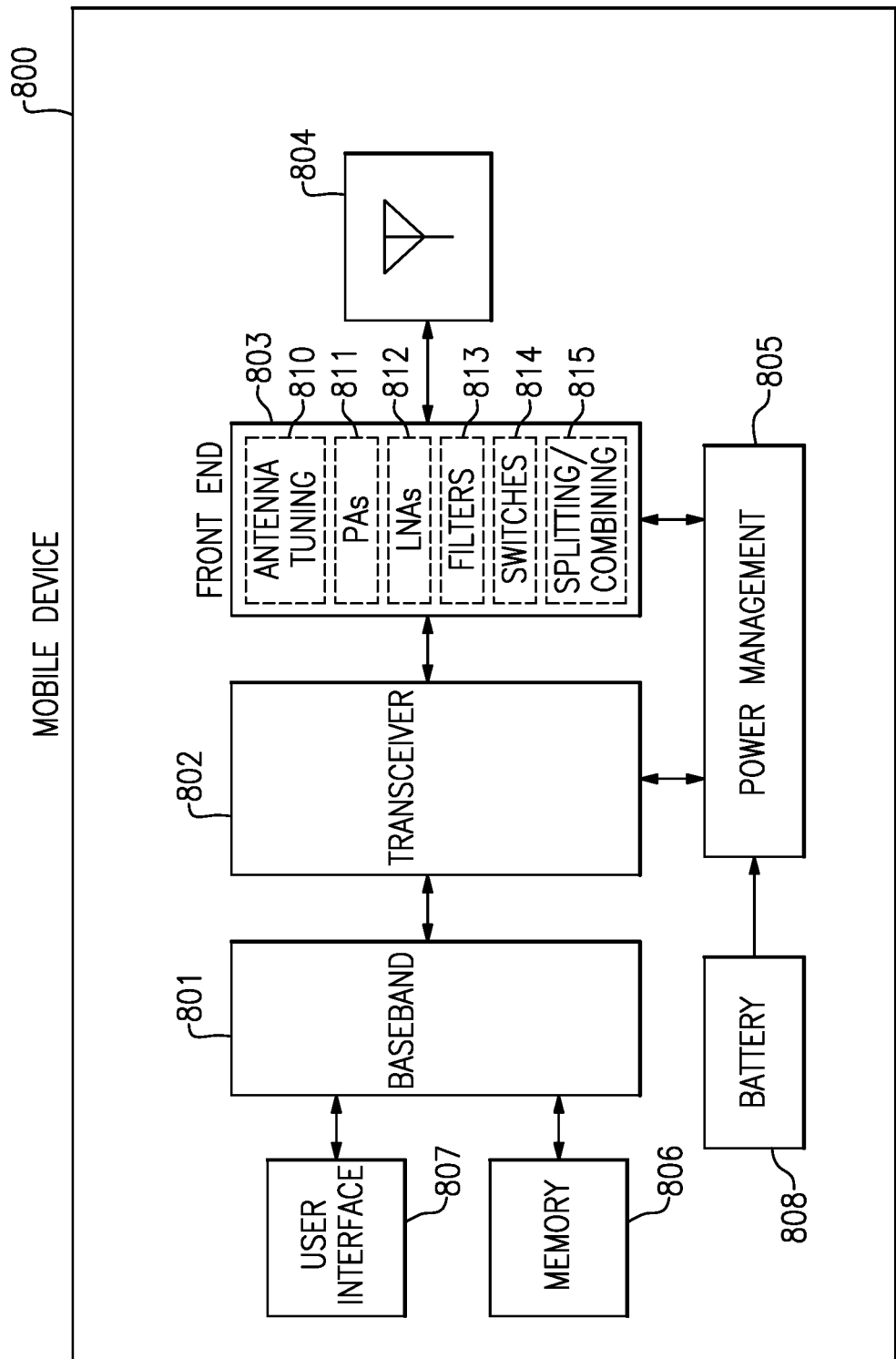
FIG. 2 is a schematic diagram of one embodiment of a mobile device.

FIG. 2 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 2 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 2, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 2, the power management system 805 receives a battery voltage from the battery 808. The battery 808 can be any suitable battery for use in the mobile device 800, including, for example, a lithium-ion battery.

Figure 3:
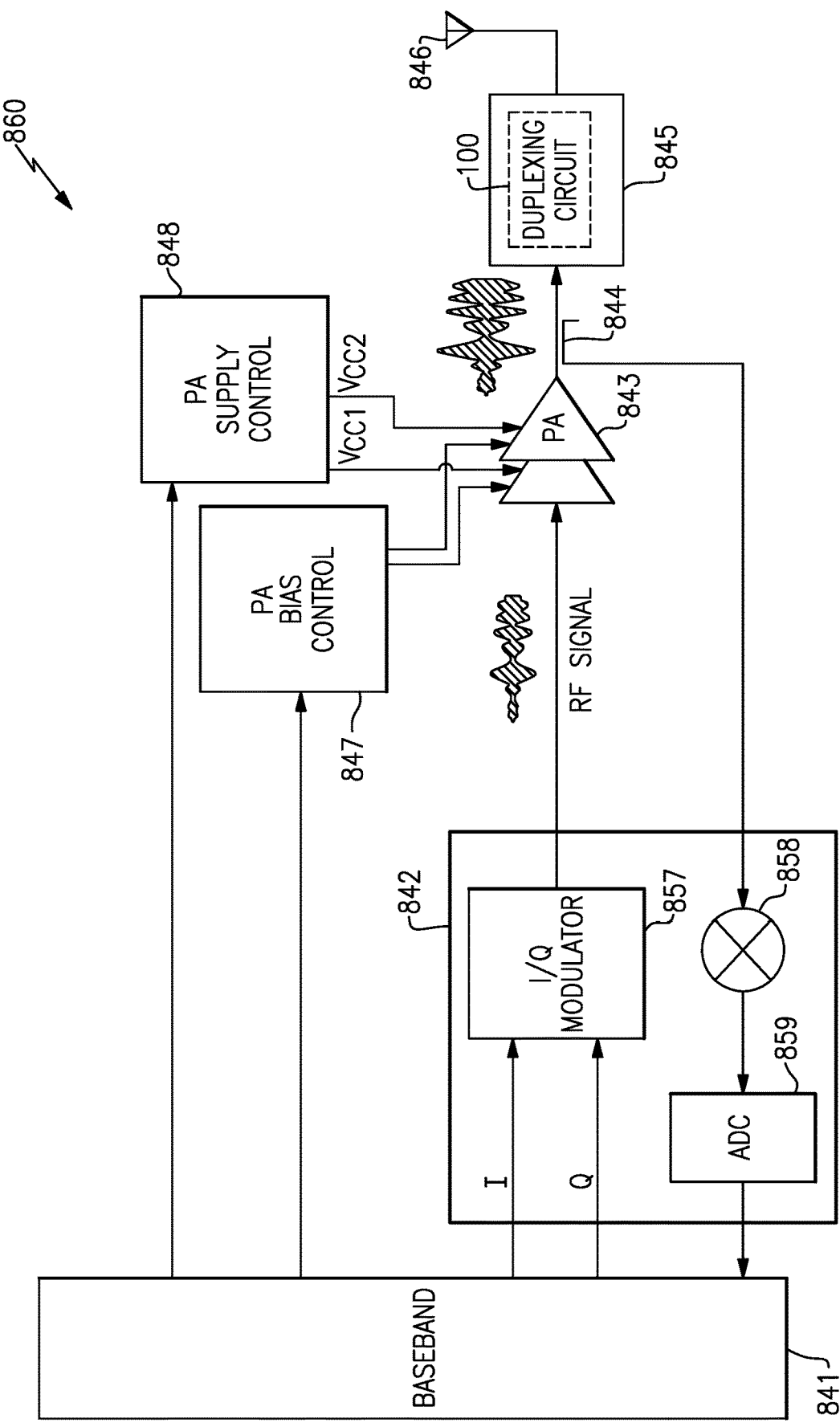
FIG. 3 is a schematic diagram of a power amplifier system according to one embodiment.

FIG. 3 is a schematic diagram of a power amplifier system 860 according to one embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846. In the embodiment illustrated in FIG. 3, the front-end circuitry 845 includes a duplexing circuit 100 which may include one or more duplexers, as described below.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 3, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Example Duplexing Filter Circuits with Transmit Signal Cancellation

Figure 4:
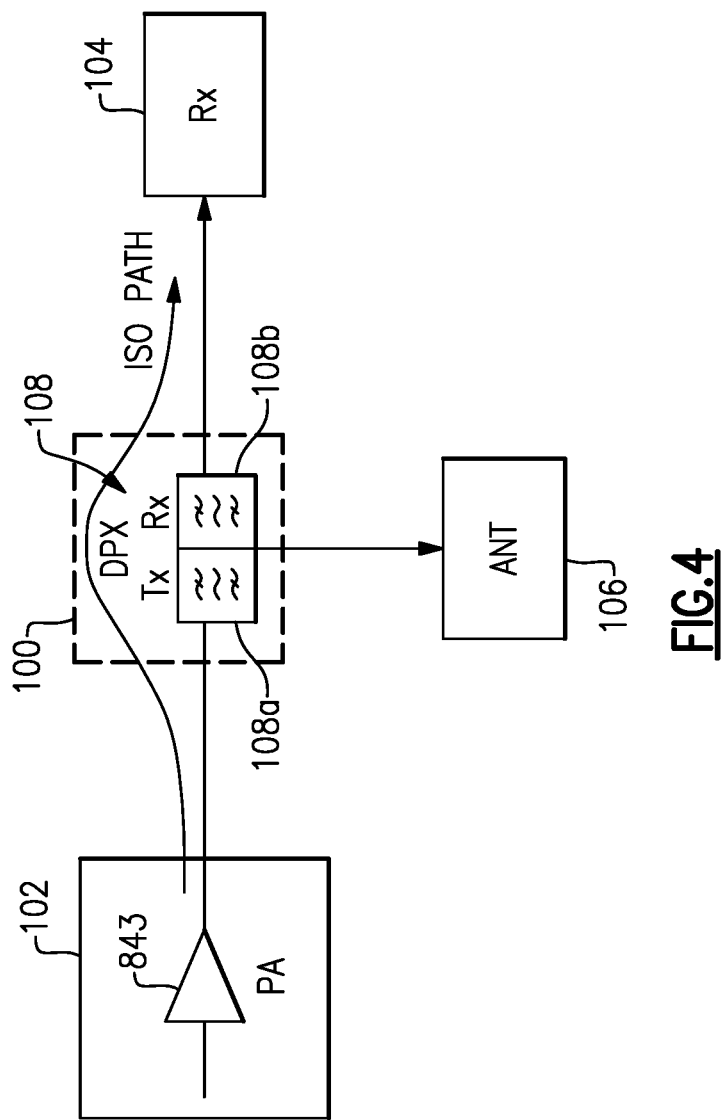
FIG. 4 is an example embodiment of a duplexer circuit that can be used in an FDD or TDD radio front-end.

FIG. 4 is an example embodiment of a duplexer circuit 100 that can be used in an FDD or TDD radio front-end. As shown in FIG. 4, the duplexer circuit 100 is connected between a transmit (Tx) port 102, a receive (Rx) port 104, and an antenna (ANT) port 106. The transmit port 102 includes one or more power amplifiers (PAs) 843 configured to amplify an RF signal and provide the amplified RF signal to an antenna connected to the antenna port 106. Although not illustrated, the receive port 104 may include one or more LNAs (e.g., the LNAs 812 of FIG. 2) and the antenna port 106 may include an antenna (e.g., the antenna 804 of FIG. 2 or the antenna 846 of FIG. 3).

The duplexer circuit 100 includes a duplexer 108 including a transmit (Tx) filter 108a and a receive (Rx) filter 108b coupled together at a common node, such as an antenna node coupled to the antenna port 106. An isolation path 107 is formed between the transmit port 102 and the receive port 104. In some implementations, the duplexer 108 can be implemented as a surface acoustic wave (SAW) duplexer, which can provide relatively wide bandwidth. However, this disclosure is not limited thereto and in other implementations, the duplexer 108 can be implemented as an LC filter or any other type of appropriate filter technology.

The transmit and receive filters 108a and 108b can be bandpass filters that respectively allow signals having the frequencies of the transmit and receive bands to reject or attenuate frequencies outside of the respective pass bands. Since the transmit and receive bands do not have overlapping frequencies, the RF transmit signals received from the power amplifier can be attenuated by the combination of the transmit and receive filters 108a and 108b such that the RF transmit signal is prevented from reaching the LNA on the receive port 104. That is, the duplexer 100 is configured to substantially block all frequencies along the isolation path 107 from the transmit port 102 to the receive port 104.

However, in practice there may be a certain amount of leakage of the RF signals through one or more of the transmit and receive filters 108a and 108b forming the duplexer circuit 100. In FDD and/or TDD radio front-ends, performance can be limited due to leakage of noise and/or interference through the duplexing filters 108a and 108b. For instance, the amplified RF signal received from the transmit port 102 may leak through the duplexer 108 to the duplexer receive output ports and onto the receive port 104. The leakage of noise and interferences through the duplexing filters 108a and 108b to the receive port 104 can include all the gained up transceiver noise in the receive band, the power amplifier 843 added noise in the receive band, as well as the transmit carrier leakage that is provided from the transmit port 102 to the transmit input of the duplexer 100 which can leak unintentionally across the duplexer 100 to the receive port 104. The transmit carrier leakage can result in a significant performance impact.

One technique for reducing leakage through the duplexer 100 is to provide stronger attenuation of the duplexer 100 in order to reach desired isolation values. Filter which provide stronger out-of-band attenuation typically also have higher the insertion loss within-band for both the transmit and receive filters 108a and 108b. In addition, such filters once phased properly within the duplexer 100 itself also provide better transmit-to-receive isolation. Single filters have invested in higher Q technology in order to achieve steeper skirts and better isolation, especially for comparatively difficult bands with a relatively narrow duplex gap and a relatively small frequency spacing between the transmit and receive bands.

Duplex spacing or duplex distance generally refers to the space between the transmit and receive frequencies. As the duplex spacing decreases, the band gap (e.g., the space between the transmit and receive bands) also decreases. In 5G, the duplex spacing for many bands may be in the range of about 40-300 MHz, which may be relatively tight compared to legacy network technologies.

Figure 5:
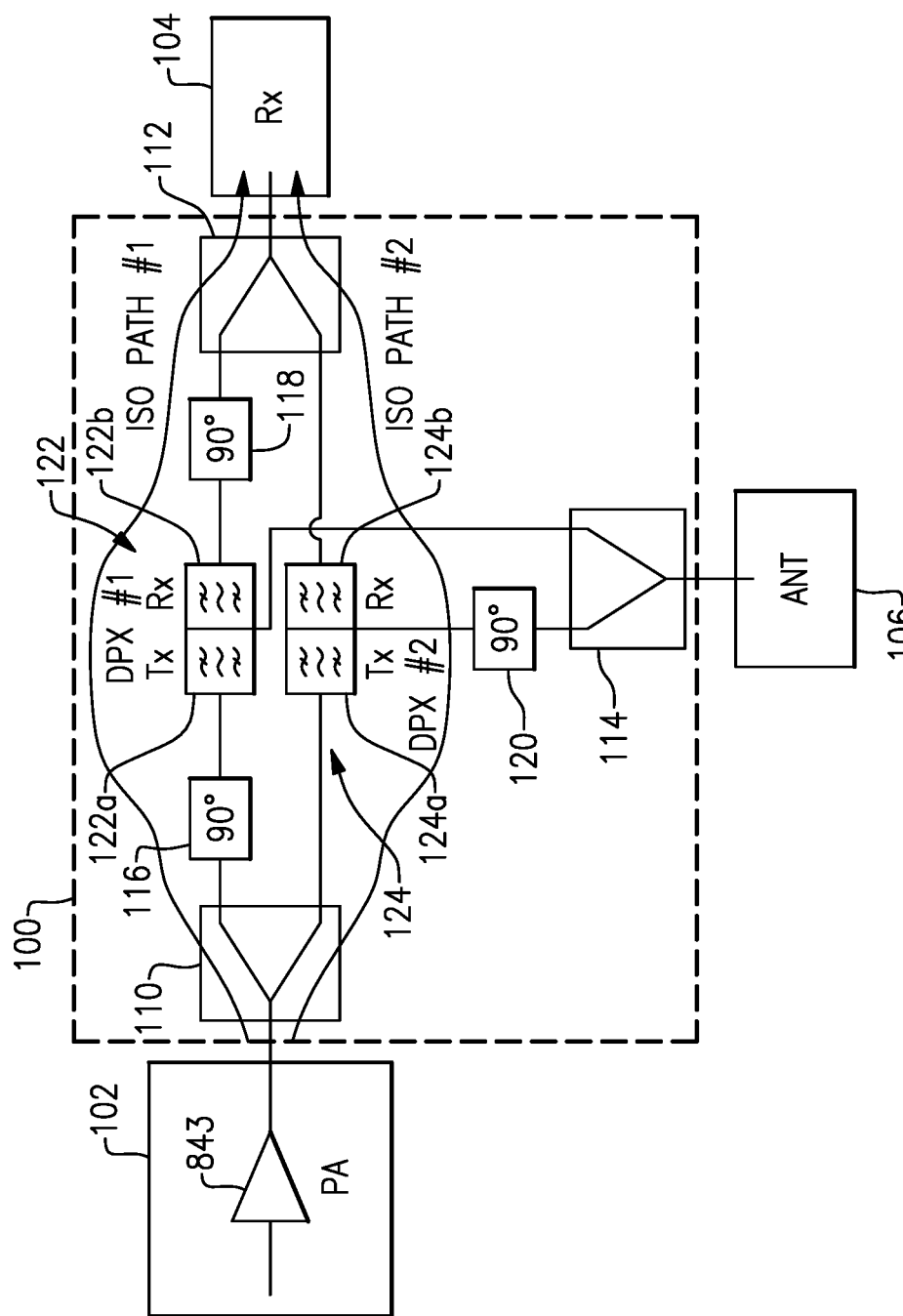
FIG. 5 is an example embodiment of a duplexer circuit that can be used in an FDD or TDD radio front-end in accordance with aspects of this disclosure.

Aspects of this disclosure relate to a duplexer circuit 100 that can reduce leakage from the transmit port 102 to the receive port 104 without adjusting the out-of-band attenuation of the filters used in the duplexer circuit 100. FIG. 5 is an example embodiment of a duplexer circuit 100 that can be used in an FDD or TDD radio front-end in accordance with aspects of this disclosure. The duplexer circuit 100 is coupled to a transmit port 102, a receive port 104, and an antenna port 106. The duplexer circuit 100 includes a transmit splitter 110, a receive splitter 112, and an antenna splitter 114, respectively coupled to the transmit port 102, the receive 104 port, and the antenna port 106.

The duplexer circuit 100 further includes a first phase shifter 116, a second phase shifter 118, a third phase shifter 120, a first duplexer 122, and a second duplexer 124. In addition, a first isolation path 107 and a second isolation path 109 are formed between the transmit port 102 and the receive port 104. In certain implementations, each of the first to third phase shifters 116-120 is configured to provide a substantially 90° phase shift. The first and second duplexers 122 and 124 may be substantially matched and each include a transmit filter 122a, 124a and a receive filter 122b, 124b.

As shown in FIG. 5, the use of the splitters 110-114 provides parallel paths between each of the transmit port 102, the receive port 104, and the antenna port 106. The first to third phase shifters 116-120 are located such that the parallel paths cancel RF signals between the transmit port 102 and the receive port 104 and sum coherently between the antenna port 106 and each of the transmit and receive ports 102 and 104. For example, the first and second splitters 110 and 112, the first and second phase shifters 116 and 118, and the first and second duplexers 122 and 124 form the first and second isolation paths 107 and 109. In detail, the first and second phase shifter 116 and 118 are both formed on the first isolation path 107 while no phase shift is applied on the second isolation path 109. Thus, the first isolation path 107 provides a 180° phase shift compared to the second isolation path 109 such that the RF leakage signal along the first isolation path 107 cancels the RF leakage signal along the second isolation path 109. By providing cancelation of the RF leakage signals along the first and second isolation paths 107 and 109, the isolation between the transmit port 102 and the receive port 104 is increased without altering the construction of the first and second duplexers 122 and 124.

The duplexer circuit 100 further provides constructive summing of the paths between the transmit port 102 and the antenna port 106, as well as between the antenna port 106 and the receive port 104. For example, the first phase shifter 116 and the third phase shifter 120 are placed on respective paths such that the RF signals transmitted on the parallel paths between the transmit port 102 and the antenna port 106 are both phase shifted by 90° and thus sum constructively. Similarly, the second phase shifter 118 and the third phase shifter 120 are placed on respective paths such that the RF signals transmitted on the parallel paths between the antenna port 106 and the receive port 102 are both phase shifted by 90° and thus sum constructively.

Aspects of this disclosure which provide parallel isolation paths 107 and 109 for which one of the paths 107 and 109 is phase shifted by 180° can provide broadband active cancellation that can greatly improve the degradation of the reference sensitivity for the partnered band. As used herein, reference sensitivity generally refers to the sensitivity at the receiver even when the transmitter is off. The active transmit cancellation described herein can also potentially relax the overall filter requirements of each of the first and second duplexers 122 and 124, even for relatively small duplex spacing scenarios. Reflection from antenna port 106 mismatch may degrade the effectiveness of the cancellation, however, the cancellation is optimized with higher out-of-band attenuations. According to aspects of this disclosure, the duplexer circuit 100 may be a band-dedicated implementation.

While the use of a duplexer circuit 100 such as that of FIG. 5 may involve a larger area and/or cost compared to other techniques, the active canceling of leakage signals using matched duplexers 122 and 124 enable greater improved performance in bands that are previously only well addressed by extremely expensive (and potentially large as well) duplexers in different technologies. Thus, aspects of this disclosure can allow a lower cost and smaller duplexer circuit 100 approach to be used with higher performance for reference sensitivity.

Figure 6:
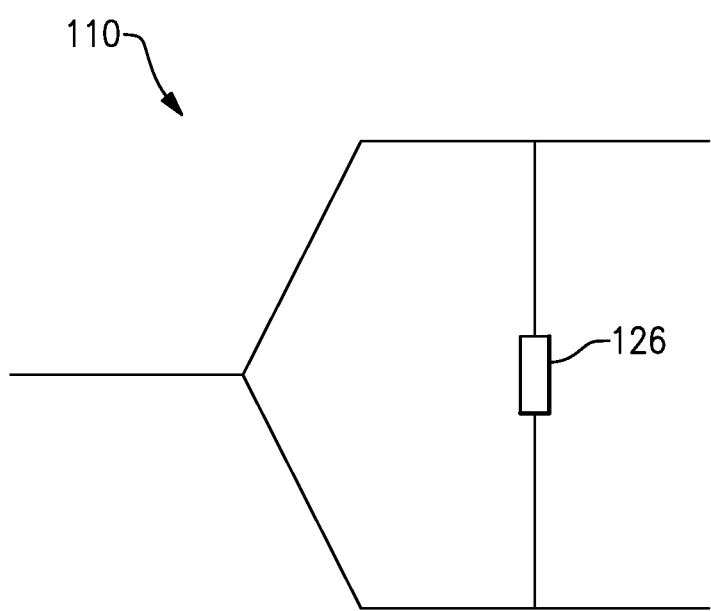
FIG. 6 illustrates an embodiment of a splitter which can be used in accordance with aspects of this disclosure.

FIG. 6 illustrates an embodiment of a splitter 110 which can be used in accordance with aspects of this disclosure. In particular, the splitter 110 is a passive power splitter that includes an impedance 126 (e.g., a dissipation resistor) connected between the two output legs of the splitter 110. In certain implementations, the splitter 110 can be embodied as a Wilkinson power splitter. In particular, a simple T-junction may function well if both sides are balanced, however, if the impedances of the legs of the T-junction are not matched, cancellation may not be as good. The use of a splitter 110 such as a Wilkinson power splitter can address this issue. The impedance 126 can dissipate impedance match between the two branches of the splitter 110.

Figure 7:
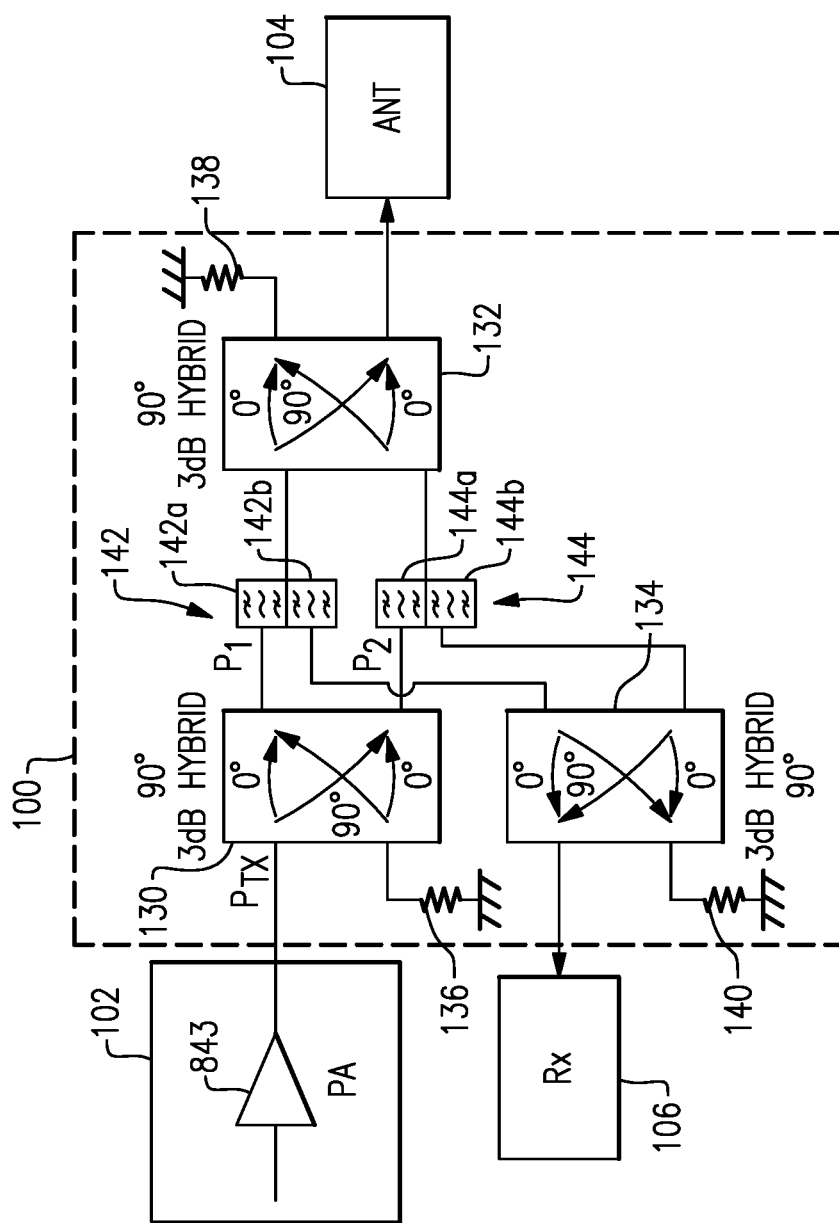
FIG. 7 is another example embodiment of a duplexer circuit that can be used in an FDD or TDD radio front-end in accordance with aspects of this disclosure.

FIG. 7 is another example embodiment of a duplexer circuit 100 that can be used in an FDD or TDD radio front-end in accordance with aspects of this disclosure. Similar to FIG. 5, the duplexer circuit 100 of FIG. 7 is coupled to a transmit port 102, a receive port 104, and an antenna port 106. The duplexer circuit 100 includes a transmit hybrid splitter 130, an antenna hybrid splitter 132, a receive hybrid splitter 134, first to third resistors 136-140, a first duplexer 142, and a second duplexer 144. The transmit, antenna, and receive hybrid splitters 130-134 are respectively connected to the transmit, antenna, and receive ports 102-106. In addition, each of the transmit, antenna, and receive hybrid splitters 130-134 are connected to ground via a corresponding one of the first to third resistors 136-140.

The transmit, antenna, and receive hybrid splitters 130-134 may be implemented as 90° 3 dB hybrid splitters (for example, the hybrid splitters 130-134 may be implemented as hybrid baluns). With reference to the transmit hybrid splitter 130 as an example, the transmit hybrid splitter 130 receives an RF signal from the transmit port 102 as an input and splits the RF signal into two RF signals, a first one of the split RF signals has no phase shift and a second one of the split RF signals has a 90° phase shift. The two RF signals output from the transmit hybrid splitter 130 are provided to the first and second duplexers 142.

Any leakage from the first split RF signal (e.g., having no phase shift) through the first duplexer 142 is applied to the third hybrid splitter 134 and undergoes no phase shift for the portion that is split to the receive port 106. Further, any leakage from the second split RF signal (e.g., having a 90° phase shift) through the second duplexer 144 is applied to the third hybrid splitter 134 and undergoes a further 90° phase shift for the portion that is split to the receive port 106. Thus, the leakage signals from the first and second split RF signals have a phase shift of 180° with respect to each other, and thus, cancel at the receive port 106.

The connections between the first to third hybrid splitters 130-134 and the first and second duplexers 142 and 144 provide for constructive interference between the transmit port 102 and the antenna port 104 as well as between the antenna port 104 and the receive port 106. Portions of the signals split via any one of the first to third hybrid splitters 130-134 which are not used for either cancelling leaking or constructive interference of the RF signals are grounded via the first to third resistors 136-140.

By providing active RF leakage cancellation between the transmit port 102 and the receive port 106, the FIG. 7 implementation may have the same advantages as discussed above in connection with the FIG. 6 implementation.

Figure 8:
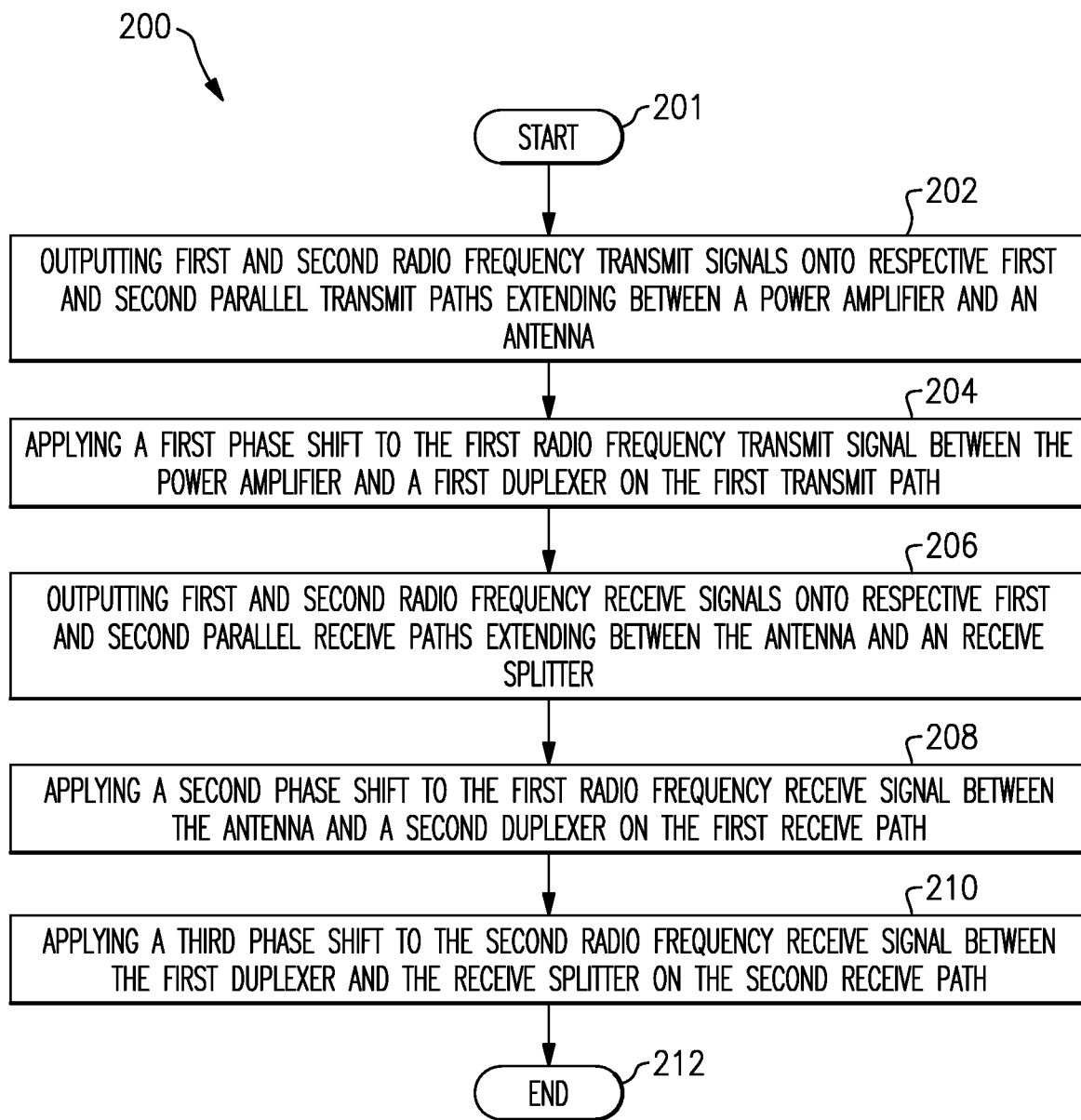
FIG. 8 is a flowchart that provides a method for improved RF leakage cancellation for a duplexer circuit used in a radio front-end in accordance with aspects of this disclosure.

FIG. 8 is a flowchart that provides a method for improved RF leakage cancellation for a duplexer circuit used in a radio front-end in accordance with aspects of this disclosure. The method 200 can be performed using the duplexer circuit 100 of either FIG. 6 or FIG. 7.

The method 200 starts at block 201. At block 202, the method 200 involves outputting first and second radio frequency transmit signals onto respective first and second parallel transmit paths extending between a power amplifier and an antenna. At block 204, the method 200 involves applying a first phase shift to the first radio frequency transmit signal between the power amplifier and a first duplexer on the first transmit path. At block 206, the method 200 involves outputting first and second radio frequency receive signals onto respective first and second parallel receive paths extending between the antenna and a receive splitter. At block 208, the method 200 involves applying a second phase shift to the first radio frequency receive signal between the antenna and a second duplexer on the first receive path. At block 210, the method 200 involves applying a third phase shift to the second radio frequency receive signal between the first duplexer and the receive splitter on the second receive path. The method 200 ends at block 212.

Further Example Duplexing Filter Circuits with Transmit Signal Cancellation

Frequency division duplex (FDD) operation involves concurrent transmit and receive, separated in frequency offset of the duplex spacing and the low noise receive path is protected from the transmit impairments by the isolation provided by the filter isolation of the duplexer. This isolation may come at the cost of insertion loss in the transmit signal (e.g., higher DC consumption and lower power capability at the antenna) and in the receive signal (degraded sensitivity even when the transmitter is off, so-called "reference sensitivity"). As the transmit power levels increase and transmit channel bandwidths increase, these challenges to protect the receiver from the transmit impairments becomes more difficult.

Transmit impairments include but are not limited to: 1) transmit leakage of modulated carrier power, 2) adjacent channel leakage ratio (ACLR) and spectral emissions regrowth falling directly onto the active receive channel, 3) ACLR that leaks through the transmit-to-receive isolation (e.g., mid-duplex gap isolation) in the form of a concentrated high amplitude intermodulation distortion (IMD) spurious, 4) receive band noise (white noise) generated in the power amplifier, 5) receive band noise (white noise) generated by the transceiver gained up by the power amplifier, 6) reverse intermodulation created at the power amplifier output from back-injected blocker mixing with the forward transmit carrier power to produce IMD that can fall onto the receive channel, and 7) farther offset harmonics or general spurious that can additionally degrade the active receive.

As described above, one technique for reducing leakage through the duplexer 100 involves providing stronger attenuation and isolation of the transmit-to-receive properties of the duplex filter (e.g., see the duplexer 108 of FIG. 4), which come at some trade-off and sacrifice to degrade (increase) the insertion loss of the transmit and receive paths. This technique may involve leveraging phase cancellation and brute force isolation properties of the duplexer to address the attenuation of the transmit impairments.

Even using stronger attenuation, there may be unavoidable transmitter power leak. Relatively high power blockers may be out of the low-noise amplifier intended pass band. Further, the typical transmit power level may be so large as to saturate the low-noise amplifier. One or more of ALCR emissions, white noise out of band, and noise components may fall directly into the active receive channel. In addition, the non-linearity of the power amplifier can create spectral regrowth.

Figure 9:
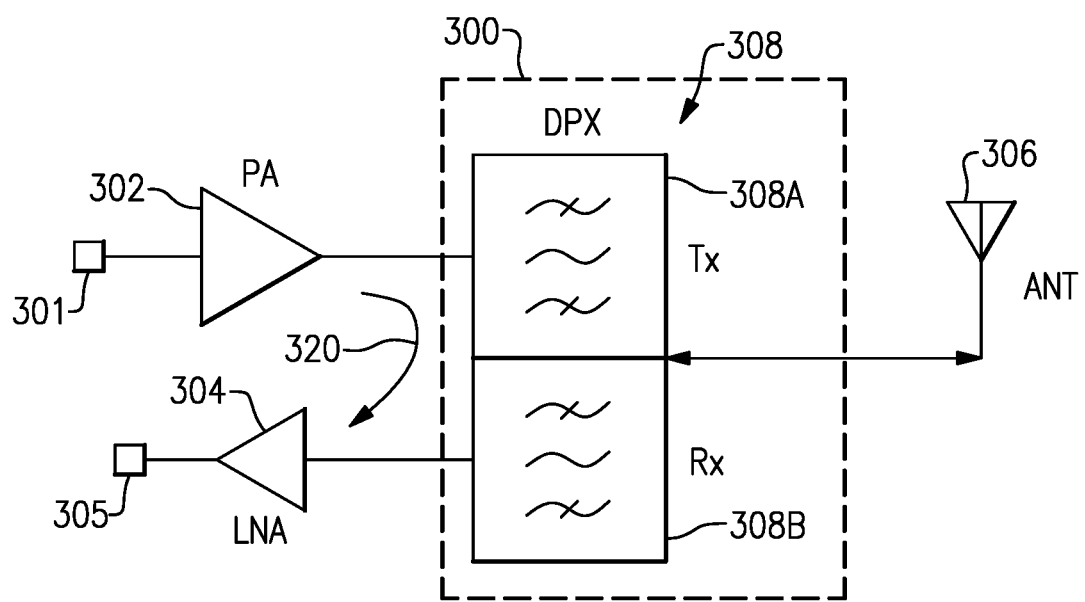
FIG. 9 is an example embodiment of a duplexer circuit that can be used in an FDD or TDD radio front-end.

FIG. 9 is an example embodiment of a duplexer circuit 300 that can be used in an FDD or TDD radio front-end. As shown in FIG. 9, the duplexer circuit 300 is connected between a power amplifier (PA) 302 connected to a transmit port 301, a low-noise amplifier (LNA) 304 connected to a receive port 305, and an antenna 306. The power amplifier 302 is configured to amplify an RF signal received from the transmit port 301 and provide the amplified RF signal to the antenna 306 via the duplexer circuit 300. The low-noise amplifier 304 is configured to receive an RF signal from the antenna 306 via the duplexer circuit 300.

The duplexer circuit 300 includes a duplexer 308 including a transmit filter 308A and a receive filter 308B, which are respectively coupled to the power amplifier 302 and the low-noise amplifier 304. The transmit filter 308A and the receive filter 308B are coupled together at a common node, such as an antenna node coupled to the antenna 306. In some implementations, the duplexer 308 can be implemented as a surface acoustic wave (SAW) duplexer, which can provide relatively wide bandwidth. However, this disclosure is not limited thereto and in other implementations, the duplexer 308 can be implemented as an LC filter or any other type of appropriate filter technology.

As shown in FIG. 9, there may be a certain amount of leakage 320 through the duplexer 308 from the power amplifier 302 to the low-noise amplifier 304. The transmit carrier leakage through the duplexer 308 can result in a significant performance impact. Some amount of leakage 320 may be present no matter how good the rejection of the duplexer 308. Thus, aspects of this disclosure relate to techniques for cancelling the leakage 320 from the transmit port 301 and the power amplifier 302 to the low-noise amplifier 304 and the receive port 305.

Aspects of this disclosure provide a matched path for the transmit leakage 320, and does not require the use of a receive channel or the antenna based out of band blocker. By amplitude and phase adjusting the matched filter leakage 320 path, cancellation of these unwanted impairments can be provided. Thus, aspects of this disclosure provide for enhanced cancellation of substantially all transmit impairments described herein, and can effectively provide much lower receive de-sense as a result, with less impact to insertion loss and even low transmit power performance.

Figure 10:
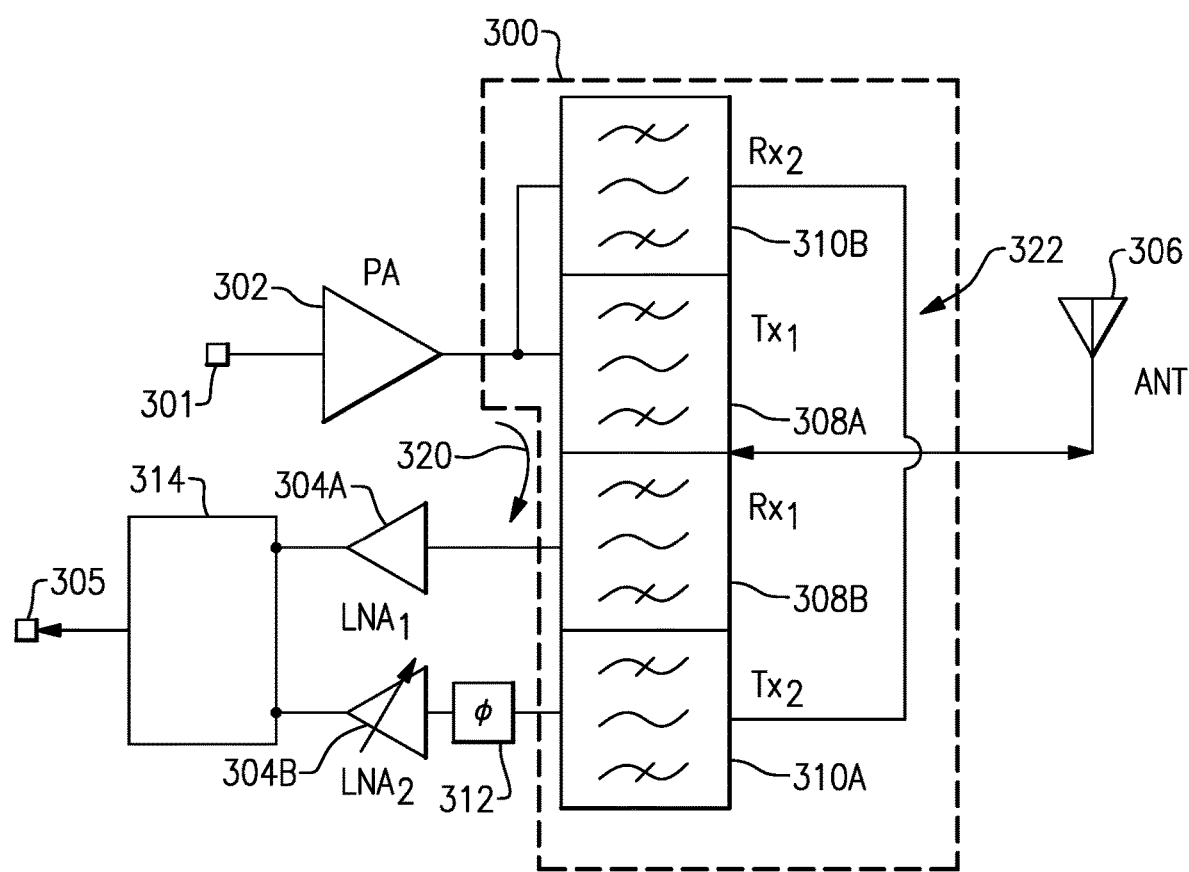
FIG. 10 is an example embodiment of a duplexer circuit that can be used in an FDD or TDD radio front-end in accordance with aspects of this disclosure.

Aspects of this disclosure can address one or all of the above-identified issues. FIG. 10 is an example embodiment of a duplexer circuit 300 that can be used in an FDD or TDD radio front-end in accordance with aspects of this disclosure. With reference to FIG. 10, the duplexer circuit 300 is connected between a power amplifier 302 connected to a transmit port 301; a first low-noise amplifier 304A, a phase shifter 312, a second low-noise amplifier 304B, and a splitter 314 connected to a receive port 305; and an antenna 306. The power amplifier 302 is configured to amplify an RF signal received from the transmit port 301 and provide the amplified RF signal to the antenna 306 via the duplexer circuit 300. The first low-noise amplifier 304A is configured to receive an RF signal from the antenna 306 via the duplexer circuit 300. Further details on the functionality of the first and second low-noise amplifiers 304A and 304B, the phase shifter 312, and the splitter 314 are provided below.

The duplexer circuit 300 includes a first transmit filter 308A and a first receive filter 308B, which may be substantially similar to the transmit and receive filters 308A and 308B of FIG. 9. The duplexer circuit 300 of FIG. 10 further includes a second receive filter 310B and a second transmit filter 310A which are electrically coupled to provide a second path 322 between the transmit port 301 and the receive port 305. The second path 322 (e.g., including the second receive filter 310B and a second transmit filter 310A) is substantially matched to a primary path which includes the first transmit filter 308A and the first receive filter 308B. Thus, the leakage current 320 flowing through the first transmit filter 308A and the first receive filter 308B may be substantially matched by a second leakage current flowing through the second path 322.

The first low-noise amplifier 304A, the phase shifter 312, the second low-noise amplifier 304B, and the splitter 314 are arranged between the duplexer circuit 300 and the receive port 305 and are configured to cancel the leakage current 320 and the second leakage current. In detail, the phase shifter 312 can be configured to shift the second leakage current by substantially 180° and the first and second low-noise amplifiers 304A and 304B are configured to respectfully amplify the first and second leakage currents by the same amount. However, in other embodiments, the phase shifter 312 may be configured to provide a different amount of phase shift or may be omitted from the circuit as described herein.

Finally, the splitter 314 (functioning as a mixer) is configured to combine the amplified leakage currents, which results in cancellation since the two leakage currents are phase offset by 180° and have substantially the same amplitude.

While a certain amount of leakage current may also be present between the transmit port 301 and the antenna 306 as well as between the antenna 306 and the receive port 305, this leakage current may be insignificant compared to the desired RF signals being communicated. For example, an RF receive signal received at the antenna 306 is provided to the first low noise amplifier 304A via the first receive filter 308B. An RF receive leakage signal must travel through the first transmit filter 308A, the second receive filter 310B, and the second transmit filter 310A before arriving at the phase shifter 312. Because the pass bands of these three filters do not overlap, the amplitude of the RF receive leakage signal will be significantly lower than the RF receive signal received at the first low noise amplifier 304A, and thus, the signal-to-noise ratio of the RF receive signal is not significantly affected by the RF receive leakage current. An RF transmit signal provided from the transmit port 301 to the antenna 306 is similarly not significantly affected by an RF transmit leakage signal.

Figure 11A:
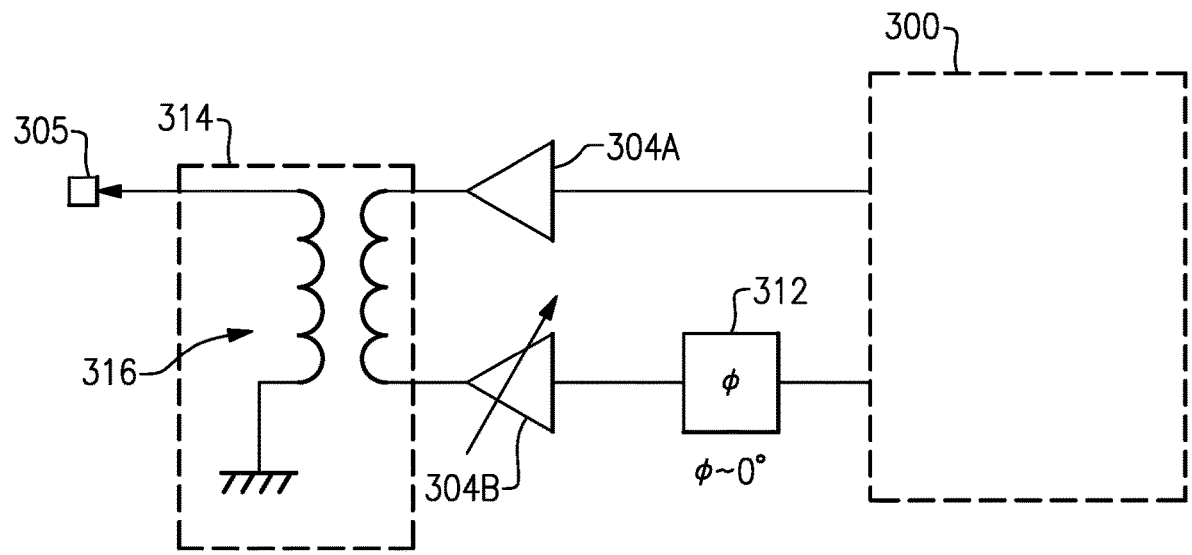
FIGS. 11A and 11B provide example embodiments of circuit configurations which can be used to connect the receive port to the duplexer circuit of FIG. 10 in accordance with aspects of this disclosure.
Figure 11B:
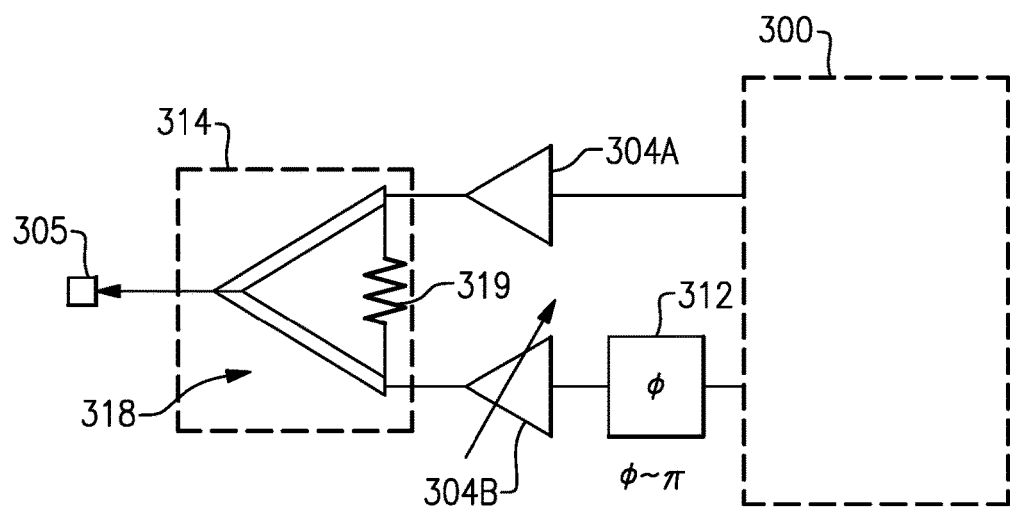

FIGS. 11A and 11B provide example embodiments of circuit configurations which can be used to connect the receive port 305 to the duplexer circuit 300 of FIG. 10 in accordance with aspects of this disclosure. With reference to the embodiment illustrated in FIG. 11A, the splitter 314 can include a balun 316 having a first loop connected between the receive port 305 and ground and a second loop connected between the first and second low-noise power amplifiers 304A and 304B. Because the balun 316 is configured to receive a balance input, the leakage signals provided by the first and second low-noise power amplifiers 304A and 304B do not need to be phase offset in order for the balun 316 to cancel the matched leakage signals. Thus, the phase shifter 312 of the FIG. 11A embodiment can be configured to provide no phase shift (e.g., 0° phase shift) or can be omitted from the circuit such that the second low-noise power amplifier 304B is directly connected to the duplexer circuit 300.

With reference to the embodiment illustrated in FIG. 11B, the splitter 314 can include a passive power splitter 318 (e.g., such as the splitter 110 illustrated in FIG. 6) configured to function as a mixer that combines the RF signals respectively received from the first and second low-noise amplifiers 304A and 304B. For example, the power splitter 318 can include an impedance 319 coupled between the inputs connected to the first and second low-noise amplifiers 304A and 304B. In the FIG. 11B embodiment, the phase shifter 312 can be configured to provide about a 180° phase shift such that the leakage currents input into the splitter 312 are substantially cancelled before reaching the receive port 305.

Figure 12:
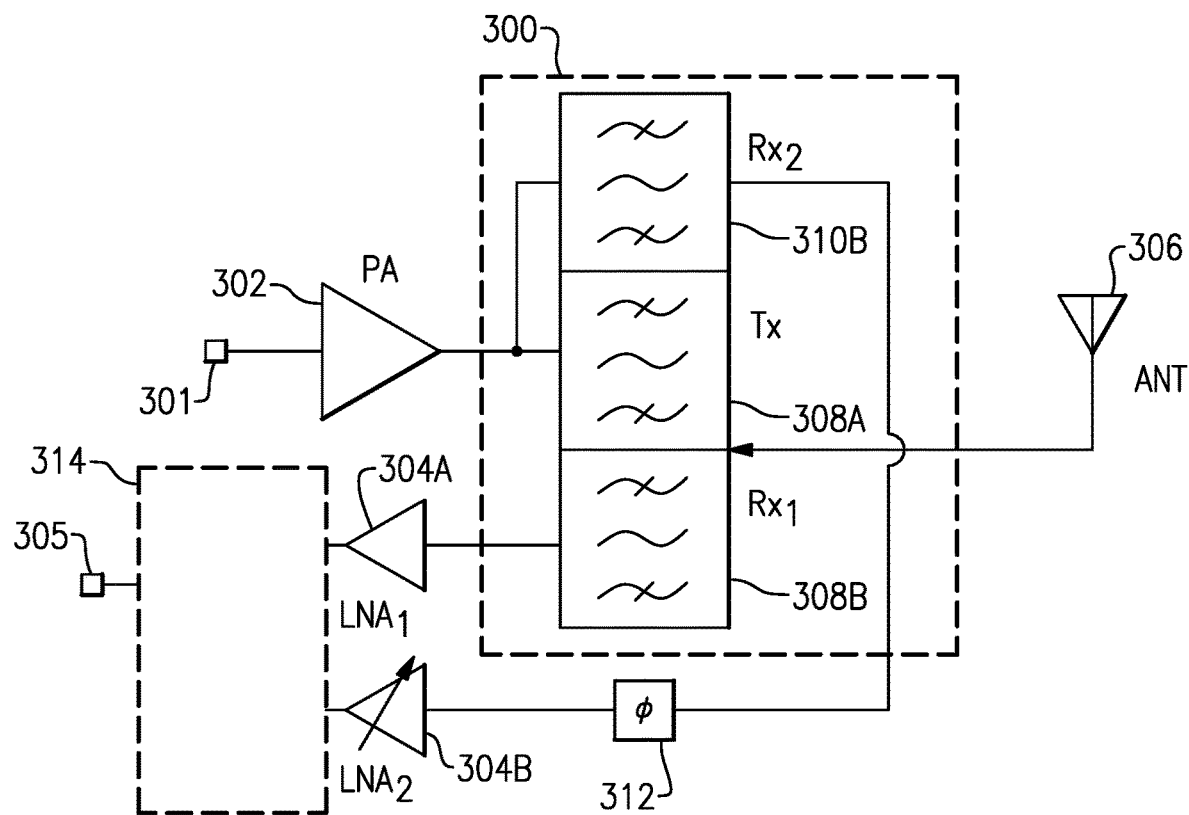
FIG. 12 is another example embodiment of a duplexer circuit that can be used in an FDD or TDD radio front-end in accordance with aspects of this disclosure.

FIG. 12 is another example embodiment of a duplexer circuit 300 that can be used in an FDD or TDD radio front-end in accordance with aspects of this disclosure. Similar to the FIG. 10 embodiment, the duplexer circuit 300 is connected between a power amplifier 302 connected to a transmit port 301; a first low-noise amplifier 304A, a phase shifter 312, a second low-noise amplifier 304B, and a splitter 314 connected to a receive port 305; and an antenna 306. The power amplifier 302 is configured to amplify an RF signal received from the transmit port 301 and provide the amplified RF signal to the antenna 306 via the duplexer circuit 300. The first low-noise amplifier 304A is configured to receive an RF signal from the antenna 306 via the duplexer circuit 300.

In contrast to the FIG. 10 embodiment, the duplexer 300 of FIG. 12 includes a transmit filter 308A, a first receive filter 308B, and a second receive filter 310B, omitting the second transmit filter 310A of FIG. 10. The second receive filter 310B is coupled to the phase shifter 312. Although a second leakage current flowing through the second receive filter 310B does not flow through a second transmit filter 310A, the second leakage current may still have substantially the same amplitude as a first leakage current flowing through the transmit filter 308A and the receive filter 308B. Thus, the first low-noise amplifier 304A, the phase shifter 312, the second low-noise amplifier 304B, and the splitter 314 can be configured to cancel the first and second leakage currents before the leakage currents reach the receive port 305. In some embodiments, splitter 314 can be implemented using one of the embodiments of FIGS. 11A and 11B.

Example Duplexing Filter Circuits with EM Coupling Cancellation

Figure 13A:
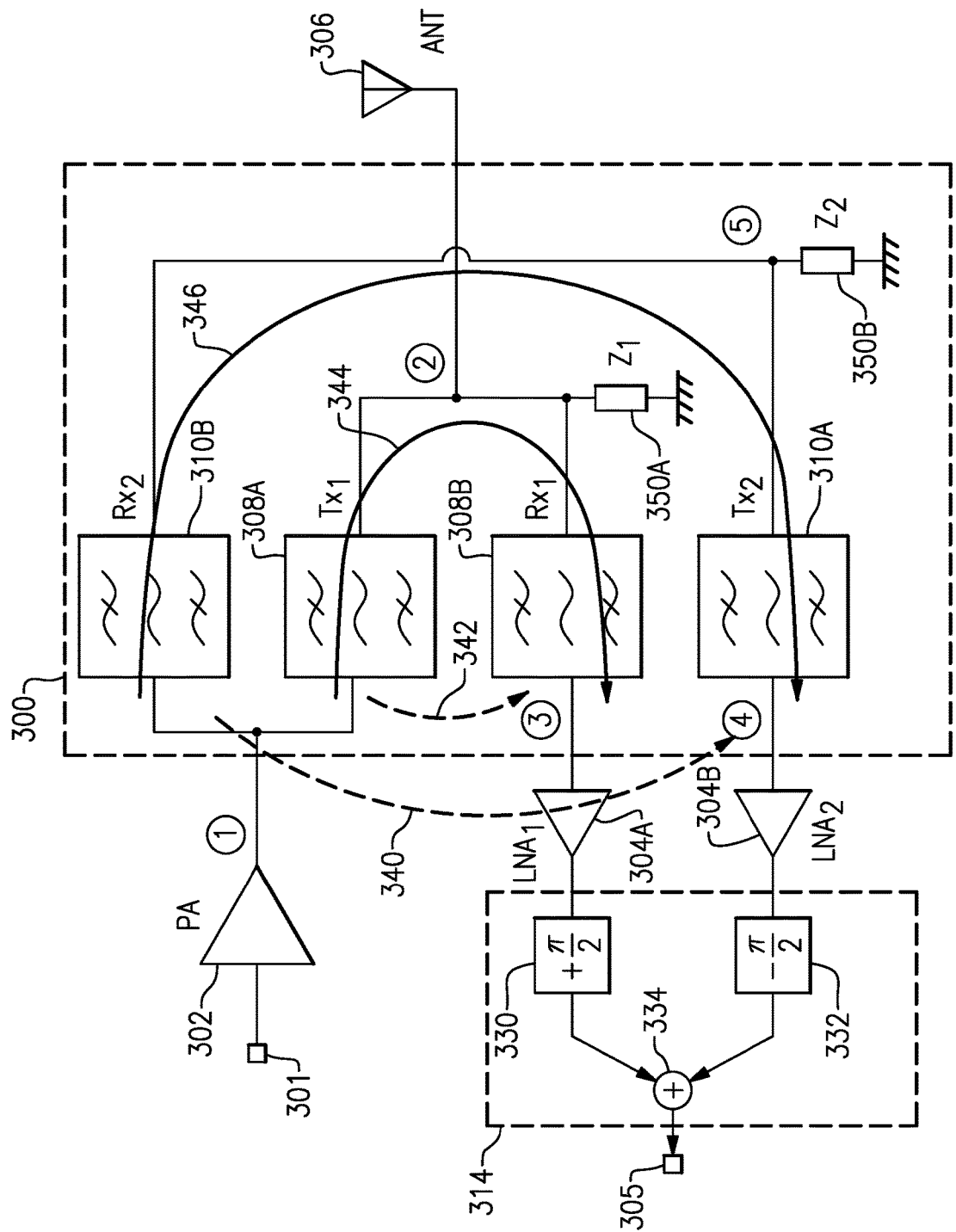
FIGS. 13A and 13B illustrate yet another example embodiment of a duplexer circuit that can be used in an FDD or TDD radio front-end in accordance with aspects of this disclosure.
Figure 13B:
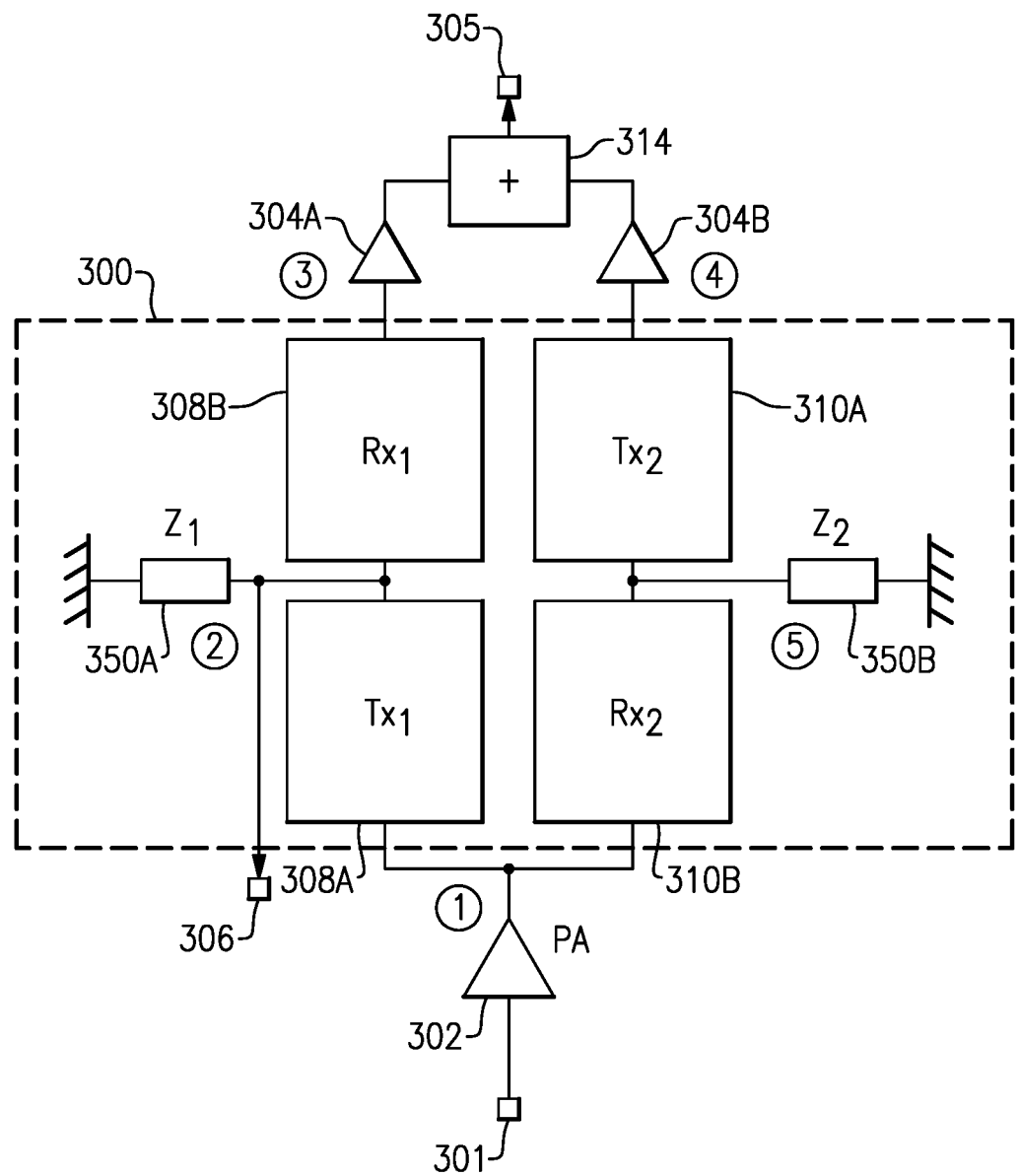

FIGS. 13A and 13B illustrate yet another example embodiment of a duplexer circuit 300 that can be used in an FDD or TDD radio front-end in accordance with aspects of this disclosure. In particular, FIG. 13A illustrates the duplexer 300 with a circuit diagram oriented similar to that of FIGS. 10 and 12, while FIG. 13B illustrates an alternative view of the circuit diagram for the duplexer 300 of FIG. 13A.

With reference to FIGS. 13A and 13B, the duplexer circuit 300 is connected between a power amplifier 302 connected to a transmit port 301; a first low-noise amplifier 304A, a second low-noise amplifier 304B, and a splitter 314 connected to a receive port 305; and an antenna 306. The power amplifier 302 is configured to amplify an RF signal received from the transmit port 301 and provide the amplified RF signal to the antenna 306 via the duplexer circuit 300. The first low-noise amplifier 304A is configured to receive an RF signal from the antenna 306 via the duplexer circuit 300.

FIG. 13A further illustrates an embodiment of the splitter 314, which can be combined with any other embodiment disclosed herein. In this embodiment, the splitter 314 includes a first phase shifter 330, a second phase shifter 332, and a mixer 334. The first phase shifter 330 can be configured to apply a positive 45° phase shift and the second phase shifter 332 can be configured to apply a negative 45° phase shift. Accordingly, the two signals receives at the mixer 334 have a relative phase shift of 180° and are cancelled before reaching the receive port 305.

The duplexer 300 includes a first transmit filter 308A, a first receive filter 308B, a second transmit filter 310A, a second receive filter 310B, a first impedance 350A and a second impedance 350B. In the embodiment of FIGS. 13A and 13B, the filters 308A, 308B, 310A, and 310B are connected by conductive traces. The filters 308A, 308B, 310A, and 310B and conductive traces are arranged in order to match radiative coupling of EM therebetween. The first and second impedances 350A and 350B can be configured to improve impedance and loading effects.

With reference to FIG. 13A, five nodes 1-5 are illustrated at points on the conductive trances. A first EM coupling 340 may be formed between node 1 and node 4 and a second EM coupling 342 may be formed between node 1 and node 3. A first leakage current 344 and a second leakage current 346 from the transmit port 301 to the receive port 305 are also shown in FIG. 13A.

In order to substantially match the first and second EM couplings 340 and 342, the duplexer 300 may be physically laid out as shown in FIG. 13B. As shown in FIG. 13B, the filters 308A, 308B, 310A, and 310B, conductive traces, and first and second impedances 350A and 350B are arranged substantially symmetrically such that the first and second EM couplings 340 and 342 will substantially cancel at the splitter 314 before arriving at the receive port 305.

In some embodiments, the first impedance 350A may include a shunt inductor, which is applied at the common port 2 of the first transmit filter 308A and the first receive filter 308B. The shunt inductor together with a capacitor for the first transmit filter 308A can function as a parallel LC circuit, which may be resonant over a first frequency range. The LC circuit may be designed to function as an open circuit at frequencies of interest. The second impedance 350B is configured to substantially match the first impedance 350A. In some implementations, matching the first and second impedances 350A and 350B may involve tuning one or more of the first and second impedances 350A and 350B to obtain a sufficient match therebetween. That is, one or more of the first and second impedances 350A and 350B may be tunable to improve the EM coupling cancelation of the duplexer 300. In some embodiments, one or more of the first and second impedances 350A and 350B may have a programmable impedance via a switched parallel inductor coupled to ground.

Figure 14:
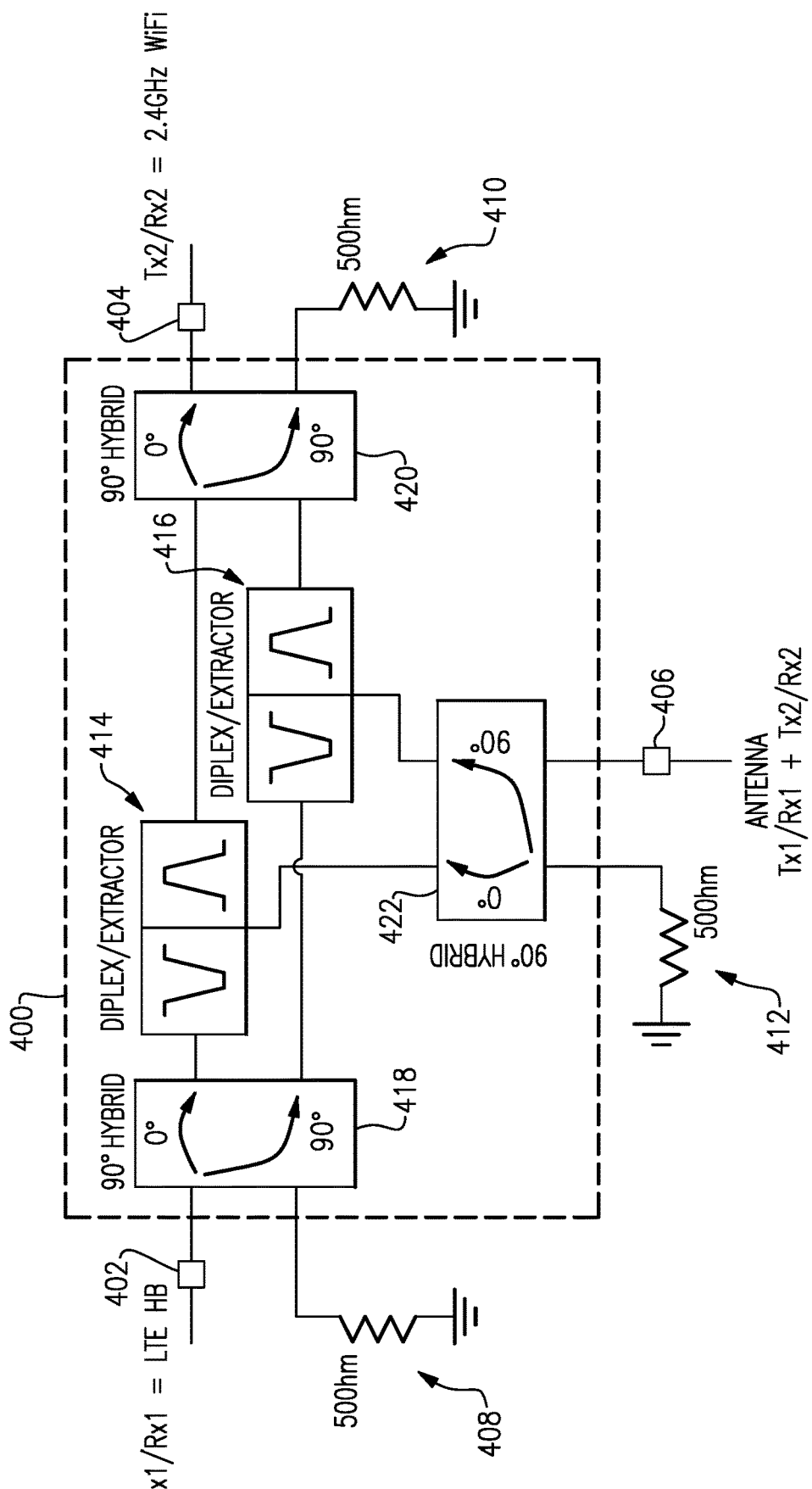
FIG. 14 is an example embodiment of a diplexer circuit that can be used to couple two different communication technologies to an antenna in accordance with aspects of this disclosure.

Example Diplexing Filter Circuits with Signal Cancellation Between Different Communication Technologies FIG. 14 is an example embodiment of a diplexer circuit 400 that can be used to couple two different communication technologies to an antenna in accordance with aspects of this disclosure. The diplexer circuit 400 of FIG. 14 is coupled to a cellular port 402, a Wi-Fi port 404, and an antenna port 406. Thus, the diplexer circuit 400 is configured to selectively connect one of the cellular port 402 and the Wi-Fi port 404 to the antenna port 406 for wireless communication. The diplexer circuit 400 is further connected to ground via a plurality of resistors 408, 410, and 412.

The diplexer circuit 400 includes first and second diplex filters 414 and 416, a cellular hybrid splitter 418, a Wi-Fi hybrid splitter 420, and an antenna hybrid splitter 422. The cellular, Wi-Fi, and antenna hybrid splitters 418-422 are respectively connected to the cellular, Wi-Fi, and antenna ports 402-406. In addition, each of the cellular, Wi-Fi, and antenna hybrid splitters 418-422 are connected to ground via a corresponding one of the first to third resistors 408-412.

Similar to the FIG. 7 embodiment, the cellular, Wi-Fi, and antenna hybrid splitters 418-422 may be implemented as 90° 3 dB hybrid splitters (for example, the hybrid splitters 418-422 may be implemented as hybrid baluns). The diplexer circuit 400 is configured to reduce leakage signals between the cellular port 402 and the Wi-Fi port 404 by providing two paths therebetween with the leakage signals on the two paths cancelling each other.

With reference to the cellular hybrid splitter 418 as an example, the cellular hybrid splitter 418 receives an RF signal from the cellular port 402 as an input and splits the RF signal into two RF signals. A first one of the split RF signals has no phase shift and is provided to the first diplexer 414 and a second one of the split RF signals has a 90° phase shift and is provided to the second diplexer 416.

Any leakage from the first split RF signal (e.g., having no phase shift) through the first diplexer 414 is applied to the Wi-Fi hybrid splitter 420 and undergoes no phase shift for the portion that is split to the Wi-Fi port 404. Further, any leakage from the second split RF signal (e.g., having a 90° phase shift) through the second diplexer 416 is applied to the Wi-Fi hybrid splitter 420 and undergoes a further 90° phase shift for the portion that is split to the Wi-Fi port 404. Thus, the leakage signals from the first and second split RF signals have a phase shift of 180° with respect to each other, and thus, cancel at the Wi-Fi port 404. Signal originating from the Wi-Fi port 404 undergo a similar cancellation on the path to the cellular port 402.

The connections between the cellular, Wi-Fi, and antenna hybrid splitters 418-422 and the first and second diplexers 414 and 416 provide for constructive interference between the cellular port 402 and the antenna port 406 as well as between the Wi-Fi port 404 and the antenna port 406. Portions of the signals split via any one of the cellular, Wi-Fi, and antenna hybrid splitters 418-422 which are not used for either cancelling leaking or constructive interference of the RF signals are grounded via the first to third resistors 408-412.

By providing active RF leakage cancellation between the cellular port 402 and the Wi-Fi port 410, the FIG. 14 implementation may have the same advantages as discussed above in connection with the implementations of FIGS. 6 and 7.

The embodiment of FIG. 14 can address limited isolation and impedance termination challenges that limit low loss diplexing (impedance loading of one path depends on impedance loading other path, which can result in "suck-outs" and poor impedance loading depending on frequency-dependent phase of the complex terminations) by employing balanced configuration that substantially guarantees 50 Ohm. In other implementations, the diplexer isolation may be relaxed, which results in this problem and eventually the diplexer is unusable due to this variability in the application.

The embodiment of FIG. 14 can also enhance the isolation between the cellular port 402 and the Wi-Fi port 404 by the isolation property of the hybrid splitters 418-422 (e.g., which may have 20-25 dB isolation). The first to third resistors 408-412 may provide a substantially ideal match for the dixplers 414 and 416 to the antenna 406. The isolation may be above a threshold within a given range of the band edge for the transmit and receive bands. The transmit leakage and receive band can be suppressed in both directions (e.g., from cellular to Wi-Fi and from Wi-Fi to cellular). By providing this cancellation, aspects of this disclosure can provide higher isolation with a difficult impedance loading vs. out of band attenuation trade-off than compared to other approaches.

When the bandwidth of the hybrid splitters 418-422 is wider than a threshold value, the second harmonics can also be phase cancelled in both directions (e.g., from cellular to Wi-Fi and from Wi-Fi to cellular).

One example implementation is between band B40 (e.g., 2.3-2.4 GHz) and B41 (e.g., 2.496-2.69 GHz) for LTE for the cellular signal and 2.4 GHz Wi-Fi that is in between B40 and B41 (e.g., 2.403-2.495 GHz). Aspects of this disclosure enables 20-25 dB enhanced isolation for this extremely challenging coexistence case, and potentially greatly relaxes the filter attenuation required (e.g., less impedance loading).

According to aspects of this disclosure, the termination 402-406 may be used for sensing the reflected/non-coherent desired signals, and potentially used in further signal cancellation schemes for advantage in coexistence by the radio.

Figure 15:
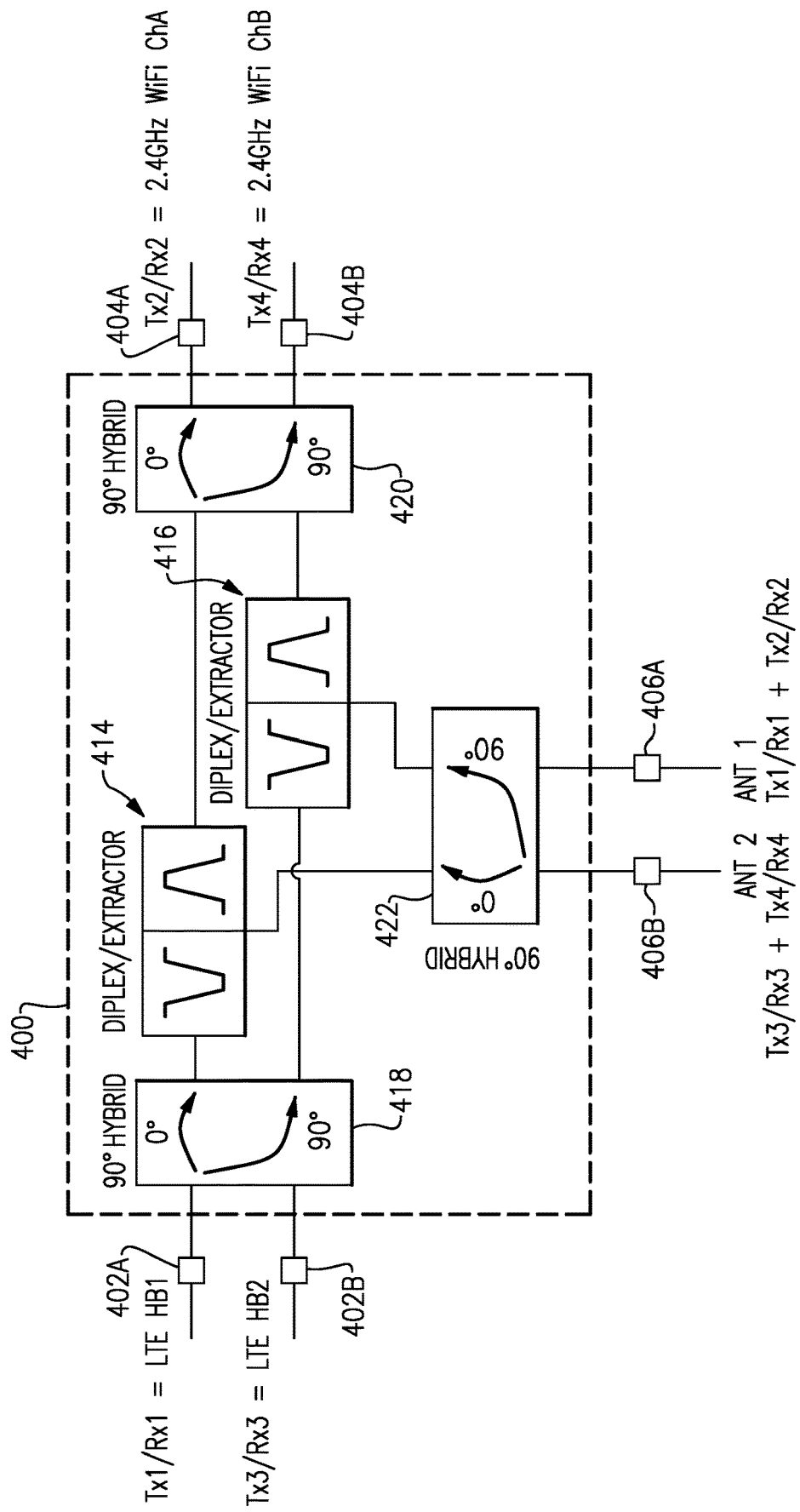
FIG. 15 is another example embodiment of a diplexer circuit 400 that can be used to couple two different communication technologies to two antennas in accordance with aspects of this disclosure.

FIG. 15 is another example embodiment of a diplexer circuit 400 that can be used to couple two different communication technologies to two antennas in accordance with aspects of this disclosure. The diplexer circuit 400 of FIG. 15 is coupled to a first cellular port 402A, a second cellular port 402B, a first Wi-Fi port 404A, a second Wi-Fi port 404B, an first antenna port 406A, and a second antenna port 406B. The diplexer circuit 400 is configured to selectively connect one of the first cellular port 402A and the first Wi-Fi port 404A to the first antenna port 406A as well as one of the second cellular port 402B and the second Wi-Fi port 404B to the second antenna port 406B.

The communication between the first cellular port 402A and the first Wi-Fi port 404A to the first antenna port 406A is substantially similar to that described above in connection with FIG. 14. In addition, the communication between the second cellular port 402B and the second Wi-Fi port 404B to the second antenna port 406B function similarly to the communication between the first ports 402A, 404A, and 406A. Further, cross communications between the first ports 402A, 404A, and 406A and the second ports 402B, 404B, and 406B are substantially insignificant by providing cancellation of any leakage signals from the first cellular/Wi-Fi ports 402A, 404A, and 406A and the second antenna 406B as well as cancellation of any leakage signals from the second cellular/Wi-Fi ports 402B, 404B, and 406B and the first antenna 406A.

In implementations of the FIG. 15 embodiment, by driving the additional ports of the hybrid splitters 418-422 compared to FIG. 14, additional signals can be routed through the diplexers 414 and 422 concurrently, and substantially optimally with much less loss to multiple antenna configurations. This can enable low loss carrier aggregation of closely spaced bands and channels to multiple antennas with the afore described benefits of FIG. 14 of high isolation and lower insertion loss. In one example, the impedance presented to the ports 402A-406B may be substantially ideal if close to 50 Ohm to preserve the isolation characteristics of the hybrid splitters 418-422 and balanced architecture.

Figure 16:
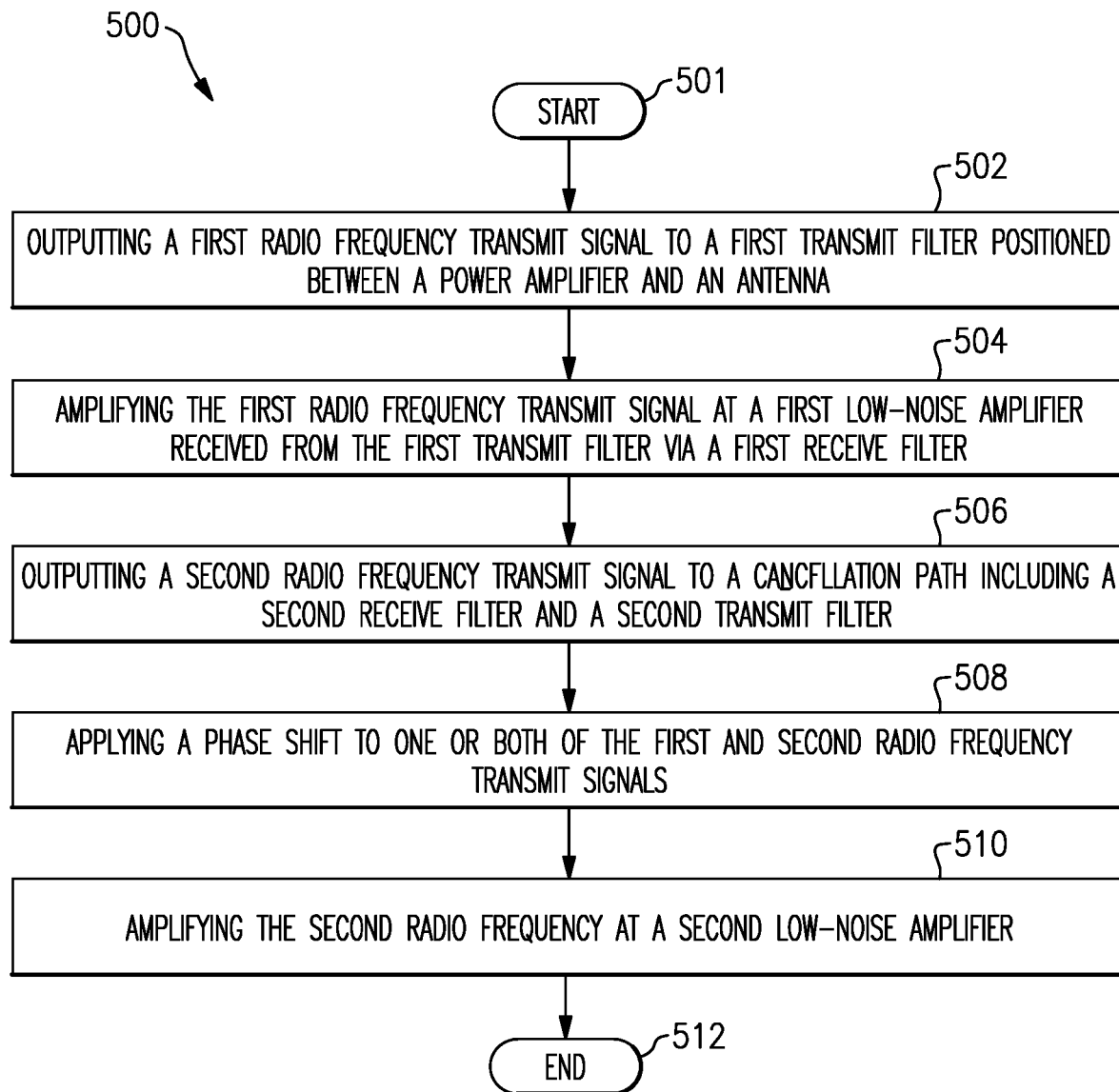
FIG. 16 is a flowchart that provides a method for improved RF leakage cancellation for a duplexer circuit used in a radio front-end in accordance with aspects of this disclosure.

FIG. 16 is a flowchart that provides a method for improved RF leakage cancellation for a duplexer circuit used in a radio front-end in accordance with aspects of this disclosure. The method 500 can be performed using the duplexer circuit 300 of any one of either FIGS. 10, 13A, and 13B.

The method 500 starts at block 501. At block 502, the method 500 involves outputting a first radio frequency transmit signal to a first transmit filter positioned between a power amplifier and an antenna. At block 504, the method 500 involves amplifying the first radio frequency transmit signal at a first low-noise amplifier received from the first transmit filter via a first receive filter. At block 506, the method 500 involves outputting a second radio frequency transmit signal to a cancellation path including a second receive filter and a second transmit filter. At block 508, the method 500 involves applying a phase shift to one or both the second radio frequency transmit signal received from the cancellation path. At block 510, the method 500 involves amplifying the phase shifted second radio frequency at a second low-noise amplifier. The method 500 ends at block 512.

Figure 17:
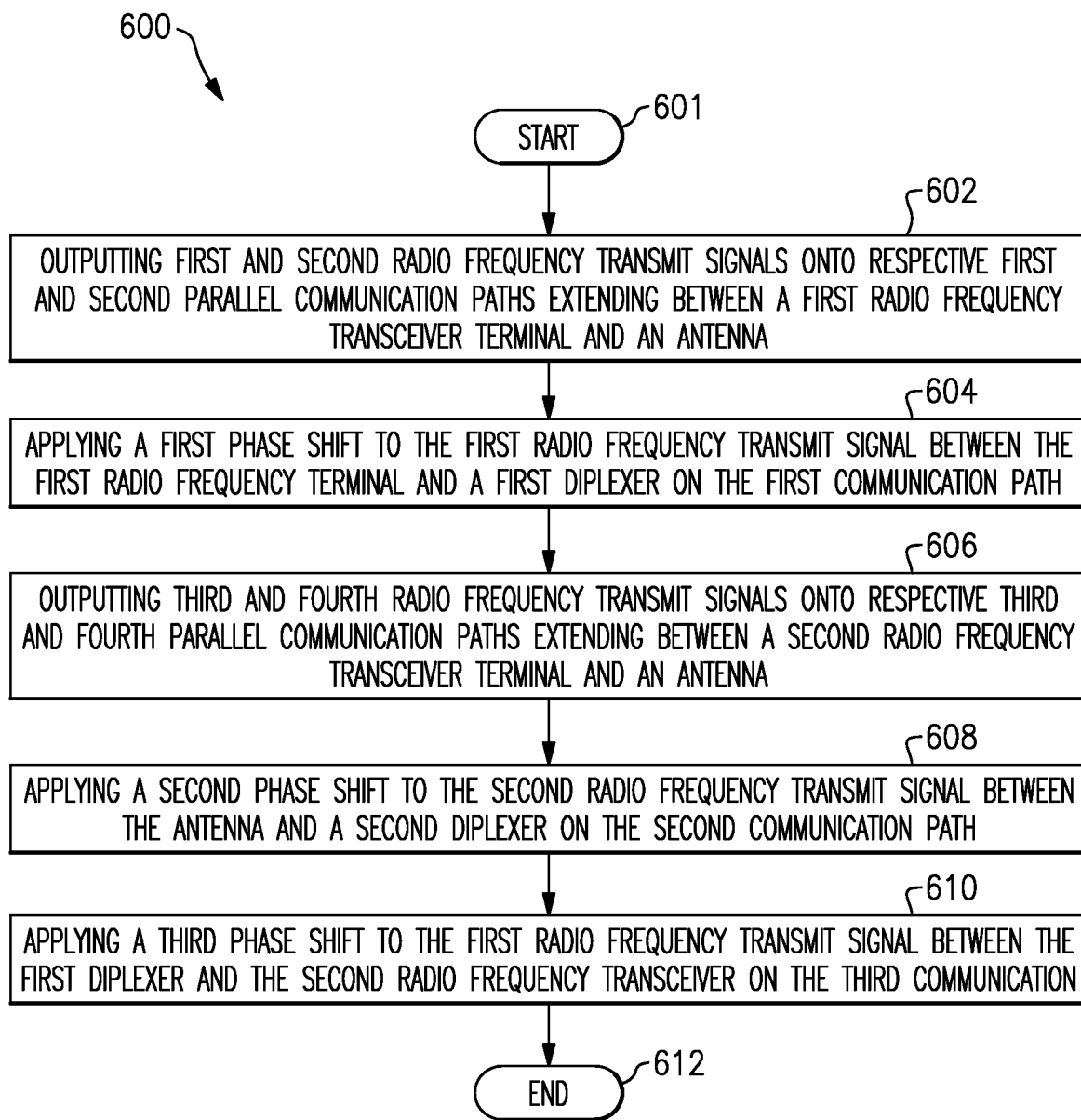
FIG. 17 is a flowchart that provides a method for improved RF leakage cancellation for a diplexer circuit in accordance with aspects of this disclosure.

FIG. 17 is a flowchart that provides a method for improved RF leakage cancellation for a diplexer circuit in accordance with aspects of this disclosure. The method 600 can be performed using the diplexer circuit 400 of any one of either FIGS. 14 and 15.

The method 600 starts at block 601. At block 602, the method 600 involves outputting first and second radio frequency transmit signals onto respective first and second parallel communication paths extending between a first radio frequency transceiver terminal and an antenna. At block 604, the method 600 involves applying a first phase shift to the first radio frequency transmit signal between the first radio frequency terminal and a first diplexer on the first communication path. At block 606, the method 600 involves outputting third and fourth radio frequency transmit signals onto respective third and fourth parallel communication paths extending between a second radio frequency transceiver and the antenna. At block 608, the method 600 involves applying a second phase shift to the second radio frequency transmit signal between the antenna and a second diplexer on the second communication path. At block 610, the method 600 involves applying a third phase shift to the first radio frequency transmit signal between the first diplexer and the second radio frequency transceiver on the third communication path. The method 600 ends at block 612.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A diplexer circuit comprising:
    first and second radio frequency ports and a first antenna port;
    first and second parallel communication paths extending between the first radio frequency port and the first antenna port, and third and fourth parallel communication paths extending between the second radio frequency port and the first antenna port; and
    a first hybrid splitter configured to apply a first phase shift to a first radio frequency transmit signal between the first radio frequency port and a first diplexer on the first communication path, a second hybrid splitter configured to apply a second phase shift to a second radio frequency transmit signal between the first antenna port and a second diplexer on the second communication path, and a third hybrid splitter configured to apply a third phase shift to the first radio frequency transmit signal between the first diplexer and the second radio frequency port on the third communication path, each of the first and second hybrid splitters having a bandwidth that is wider than a threshold value at which second harmonics of the first and second radio frequency transmit signals are cancelled in both directions.

2. The diplexer circuit of claim 1 wherein the second hybrid splitter is further configured to coherently sum the first and second radio frequency transmit signals, and the second hybrid splitter is further configured to coherently sum third and fourth radio frequency transmit signals received from the second radio frequency port.

3. The diplexer circuit of claim 1 wherein the first hybrid splitter is further configured to destructively cancel leakage of third and fourth radio frequency transmit signals received from the second radio frequency port, and the third hybrid splitter is further configured to destructively cancel leakage of the first and second radio frequency transmit signals received from the first radio frequency port.

4. The diplexer circuit of claim 1 wherein the first hybrid splitter includes a first hybrid transmit splitter, the second hybrid splitter includes a second hybrid receive splitter, and the third hybrid splitter includes a third hybrid antenna splitter.

5. The diplexer circuit of claim 1 further comprising:
    a third radio frequency port coupled to the first hybrid splitter;
    a fourth radio frequency port coupled to the third hybrid splitter;
    a second antenna port coupled to the second hybrid splitter;
    fifth and sixth parallel communication paths extending between the third radio frequency port and the second antenna port; and
    seventh and eighth parallel communication paths extending between the fourth radio frequency port and the second antenna port.

6. The diplexer circuit of claim 5 wherein the first hybrid splitter is further configured to apply a fourth phase shift to a third radio frequency transmit signal between the third radio frequency port and the first diplexer on the fifth communication path, the second hybrid splitter is further configured to apply a fifth phase shift to a fourth radio frequency transmit signal between the antenna port and the second diplexer on the sixth communication path, and the third hybrid splitter is further configured to apply a sixth phase shift to the third radio frequency transmit signal between the first diplexer and the second radio frequency port on the seventh communication path.

7. The diplexer circuit of claim 1 wherein the first radio frequency port is configured to communicate via a cellular signal, and wherein the second radio frequency port is configured to communicate via a Wi-Fi signal.

8. The diplexer circuit of claim 1 wherein the first hybrid splitter and the third hybrid splitter are configured to provide a phase shift of about 180° to the first radio frequency transmit signal.

9. The diplexer circuit of claim 1 wherein the first hybrid splitter and the second hybrid splitter are configured to provide a phase shift of about 90° to each of the first and second radio frequency transmit signals.

10. The diplexer circuit of claim 1 wherein the third hybrid splitter is configured to apply a fourth phase shift to a second radio frequency transmit signal between the second radio frequency port and the first diplexer on the third communication path, and the second hybrid splitter is configured to apply a fifth phase shift to a fourth radio frequency transmit signal between the first antenna port and the first diplexer on the fourth communication path.

11. The diplexer circuit of claim 10 wherein the second hybrid splitter and the third hybrid splitter are configured to provide a phase shift of about 90° to each of the third and fourth radio frequency transmit signals.

12. A method of diplexing radio frequency signals, the method comprising:
    outputting first and second radio frequency transmit signals onto respective first and second parallel communication paths extending between a first radio frequency port and an antenna port;
    applying, at a first splitter, a first phase shift to the first radio frequency transmit signal between the first radio frequency port and a first diplexer on the first communication path;
    outputting third and fourth radio frequency transmit signals onto respective third and fourth parallel communication paths extending between a second radio frequency port and the antenna port;
    applying, at a second splitter, a second phase shift to the third radio frequency transmit signal between the antenna port and a second diplexer on the second communication path; and
    applying, at a third splitter, a third phase shift to the first radio frequency transmit signal between the first diplexer and the second radio frequency port, each of the first, second, and third splitters having a bandwidth that is wider than a threshold value at which second harmonics of the first to fourth radio frequency transmit signals are cancelled in both directions.

13. The method of claim 12 further comprising:
    combining the first and second radio frequency transmit signals at the second splitter; and
    providing the combined first and second radio frequency transmit signals to the antenna port.

14. The method of claim 13 further comprising:
    combining the third and fourth radio frequency transmit signals received from the second radio frequency port at the second splitter; and
    providing the combined third and fourth radio frequency transmit signals to the antenna port.

15. The method of claim 12 further comprising:
    destructively cancelling the first and second radio frequency transmit signals at the third splitter coupled to the second radio frequency port.

16. The method of claim 12 further comprising:
destructively cancelling leakage of the third and fourth radio frequency transmit signals received from the second radio frequency port at the first splitter coupled to the first radio frequency port; and
destructively cancelling leakage of the first and second radio frequency transmit signals at the third splitter coupled to the second radio frequency port.

17. A radio frequency system comprising:
first and second radio frequency ports;
a first antenna port; and
a diplexer circuit including first and second parallel communication paths extending between the first radio frequency port and the first antenna port, third and fourth parallel communication paths extending between the second radio frequency port and the first antenna port, a first hybrid splitter configured to apply a first phase shift to a first radio frequency transmit signal between the first radio frequency port and a first diplexer on the first communication path, a second hybrid splitter configured to apply a second phase shift to a second radio frequency transmit signal between the first antenna port and a second diplexer on the second communication path, and a third hybrid splitter configured to apply a third phase shift to the first radio frequency transmit signal between the first diplexer and the second radio frequency port on the third communication path, each of the first, second, and third hybrid splitters having a bandwidth that is wider than a threshold value at which second harmonics of the first and second radio frequency transmit signals are cancelled in both directions.

18. The system of claim 17 wherein the second hybrid splitter is further configured to coherently sum the first and second radio frequency transmit signals, and the second hybrid splitter is further configured to coherently sum third and fourth radio frequency transmit signals received from the second radio frequency port.

19. The system of claim 17 wherein the first hybrid splitter is further configured to destructively cancel leakage of third and fourth radio frequency transmit signals received from the second radio frequency port, and the third hybrid splitter is further configured to destructively cancel leakage of the first and second radio frequency transmit signals received from the first radio frequency port.

20. The system of claim 17 wherein the first hybrid splitter includes a first hybrid transmit splitter, the second hybrid splitter includes a second hybrid receive splitter, and the third hybrid splitter includes a third hybrid antenna splitter.

* * * * *